US012796518B2

(12) United States Patent
Myung et al.

(10) Patent No.: US 12,796,518 B2
(45) Date of Patent: Nov. 10, 2026

(54) SEMICONDUCTOR PACKAGE

(71) Applicant: SAMSUNG ELECTRONICS CO., LTD., Suwon-si (KR)

(72) Inventors: Wooram Myung, Suwon-si (KR); Donguk Kwon, Asan-si (KR); Jiwon Shin, Daejeon (KR); KyeongHwan Jo, Sejong-si (KR); Pilsung Choi, Cheonan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 714 days.

(21) Appl. No.: 17/848,562

(22) Filed: Jun. 24, 2022

(65) Prior Publication Data

US 2023/0132054 A1 Apr. 27, 2023

(30) Foreign Application Priority Data

Oct. 21, 2021 (KR) ........................ 10-2021-0141004

(51) Int. Cl.
*H10W 72/20* (2026.01)
*H10W 72/00* (2026.01)
(Continued)

(52) U.S. Cl.
CPC ......... *H10W 72/20* (2026.01); *H10W 72/012* (2026.01); *H10W 72/072* (2026.01); *H10W 72/01257* (2026.01); *H10W 72/016* (2026.01); *H10W 72/07236* (2026.01); *H10W 72/07255* (2026.01); *H10W 72/223* (2026.01); *H10W 72/227* (2026.01); *H10W 72/232* (2026.01); *H10W 72/237* (2026.01); *H10W 72/2528* (2026.01); *H10W 72/255* (2026.01); *H10W 72/263* (2026.01); *H10W 72/267* (2026.01); *H10W 72/30* (2026.01);
(Continued)

(58) Field of Classification Search
None
See application file for complete search history.

(56) References Cited

U.S. PATENT DOCUMENTS 7,692,297 B2 4/2010 Miyazaki et al.
8,659,148 B2 2/2014 Tkaczyk et al.
(Continued)

FOREIGN PATENT DOCUMENTS

JP 2014-205235 A 10/2014
KR 1020160121839 A 10/2016
KR 1020170123376 A 11/2017

*Primary Examiner* — Jack S Chen
(74) *Attorney, Agent, or Firm* — Muir Patent Law, PLLC

(57) ABSTRACT

Disclosed is a semiconductor package including a package substrate, a semiconductor chip mounted on the package substrate, a connection solder pattern between the package substrate and the semiconductor chip, and a dummy bump between the package substrate and the semiconductor chip and spaced apart from the connection solder pattern. The connection solder pattern includes a first intermetallic compound layer, a connection solder layer, and a second intermetallic compound layer. The dummy bump includes a dummy pillar and a dummy solder pattern. A thickness of the dummy solder pattern is less than a thickness of the connection solder pattern. A melting point of the dummy solder pattern is greater than that of the connection solder layer.

20 Claims, 24 Drawing Sheets

(51) Int. Cl.
*H10W 72/30* (2026.01)
*H10W 72/90* (2026.01)
*H10W 74/15* (2026.01)
*H10W 90/00* (2026.01)

(52) U.S. Cl.
CPC .......... *H10W 72/851* (2026.01); *H10W 72/90* (2026.01); *H10W 72/923* (2026.01); *H10W 72/932* (2026.01); *H10W 74/15* (2026.01); *H10W 90/724* (2026.01); *H10W 90/734* (2026.01)

(56) References Cited

U.S. PATENT DOCUMENTS

| | | | | |
|---|---|---|---|---|
| 8,686,560 | B2 | 4/2014 | Parvarandeh et al. | |
| 9,048,221 | B2 | 6/2015 | Hasegawa et al. | |
| 9,985,008 | B2 | 5/2018 | Shi et al. | |
| 10,879,203 | B2 | 12/2020 | Chen et al. | |
| 10,950,568 | B2 | 3/2021 | Wirz et al. | |
| 2016/0300773 | A1 | 10/2016 | Lee et al. | |
| 2023/0132054 | A1* | 4/2023 | Myung | H10W 72/012 257/738 |

* cited by examiner

SEMICONDUCTOR PACKAGE

CROSS-REFERENCE TO RELATED APPLICATION

This U.S. nonprovisional application claims priority under 35 U.S.C. § 119 to Korean Patent Application No. 10-2021-0141004, filed on Oct. 21, 2021, in the Korean Intellectual Property Office, the disclosure of which is hereby incorporated by reference in its entirety.

BACKGROUND

1. Field

Embodiments relate to semiconductor packages, and more particularly, to bumps of semiconductor packages.

2. Description of the Related Art

Semiconductor devices have been rapidly developed to increase the number of electrode terminals and to decrease a pitch between the electrode terminals. Therefore, research has been increasingly conducted into reducing semiconductor devices. Semiconductor devices generally have electrical connection terminals, e.g., solder balls or bumps, for electrical connections with other electronic devices or printed circuit boards. Semiconductor devices require fine pitches between the electrical connection terminals thereof.

SUMMARY

According to some embodiments, a semiconductor package may include a package substrate; a semiconductor chip mounted on the package substrate; a connection solder pattern between the package substrate and the semiconductor chip; and a dummy bump between the package substrate and the semiconductor chip, the dummy bump being spaced apart from the connection solder pattern. The connection solder pattern may include a first intermetallic compound layer, a connection solder layer, and a second intermetallic compound layer. The dummy bump may include a dummy pillar and a dummy solder pattern. A thickness of the dummy solder pattern may be less than a thickness of the connection solder pattern. A melting point of the dummy solder pattern may be greater than a melting point of the connection solder layer.

According to some embodiments, a semiconductor package may include a package substrate; a semiconductor chip mounted on the package substrate; a connection bump between the package substrate and the semiconductor chip, the connection bump including a connection solder layer; and a dummy bump between the package substrate and the semiconductor chip, the dummy bump being spaced apart from the connection bump. The connection solder layer may include a first solder material. The dummy bump may include: a dummy pillar; and a dummy solder pattern on the dummy pillar. The dummy solder pattern may include an intermetallic compound including a second solder material different from the first solder material. A melting point of the dummy solder pattern may be greater than a melting point of the connection solder layer.

According to some embodiments, a semiconductor package may include a package substrate that includes a connection substrate pad and a dummy substrate pad, the connection substrate pad and the dummy substrate pad being on a top surface of the package substrate; a plurality of solder balls on a bottom surface of the package substrate; a semiconductor chip mounted on the top surface of the package substrate, the semiconductor chip including a dummy chip pad and a connection chip pad on the bottom surface of the semiconductor chip; a molding layer on the top surface of the package substrate, the molding layer covering the semiconductor chip; a plurality of connection bumps between the connection substrate pad and the connection chip pad; and a dummy bump between the dummy substrate pad and the dummy chip pad, the dummy bump being spaced apart from the connection bumps. Each of the connection bumps may include: a connection pillar; and a connection solder pattern on one surface of the connection pillar. The connection solder pattern may include a first intermetallic compound layer, a connection solder layer, and a second intermetallic compound layer. The dummy bump may include: a dummy pillar; and a dummy solder pattern on one surface of the dummy pillar. The connection solder layer may include a first solder material. The dummy solder pattern may include an intermetallic compound including a second solder material different from the first solder material. A thickness of the dummy solder pattern may be less than a thickness of the connection solder pattern.

BRIEF DESCRIPTION OF THE DRAWINGS

Features will become apparent to those of skill in the art by describing in detail exemplary embodiments with reference to the attached drawings, in which.

DETAILED DESCRIPTION

A semiconductor package and a method of fabricating the same according to example embodiments will be described hereinafter.

Figure 1A:
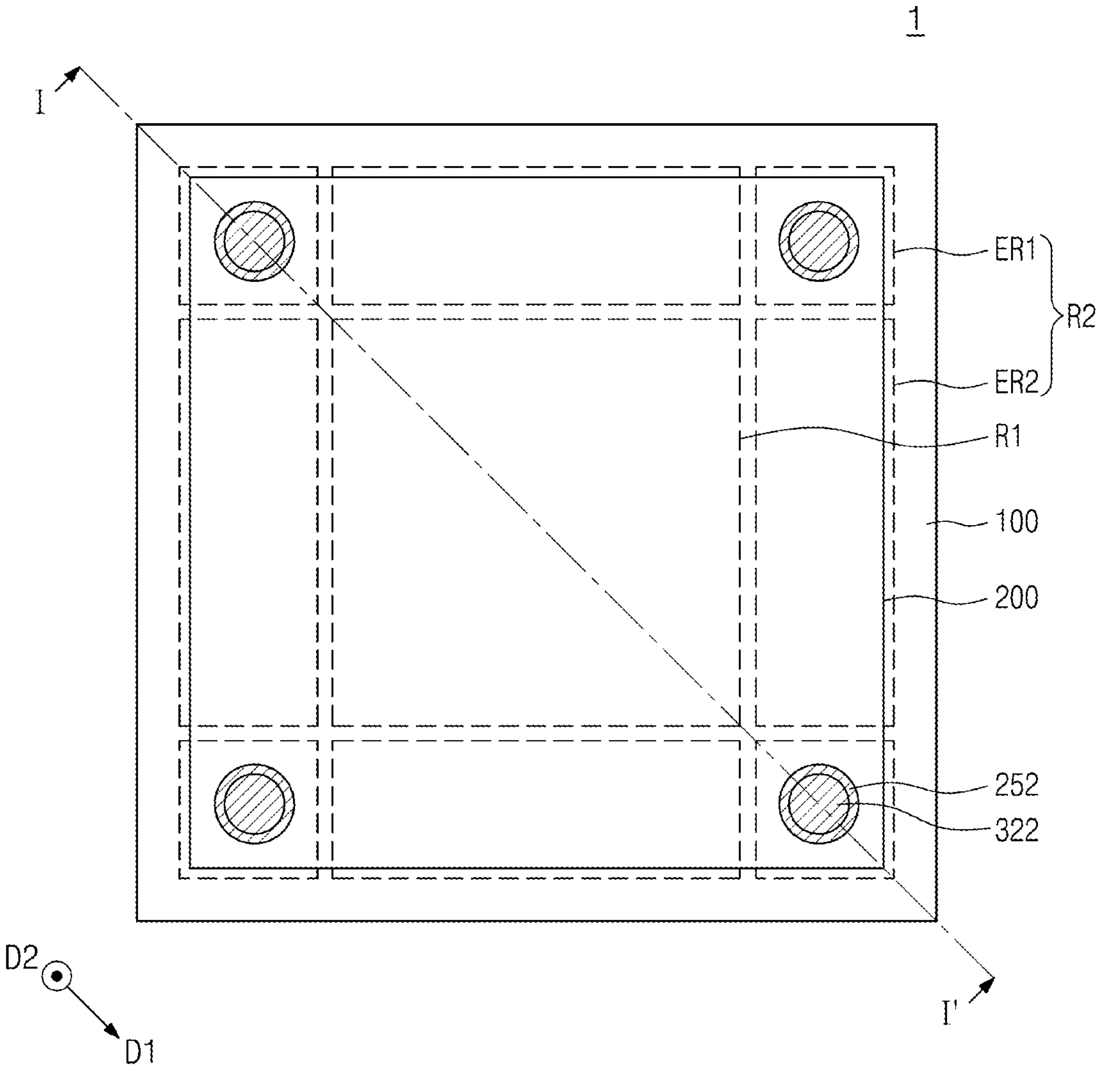
FIG. 1A illustrates a plan view showing a semiconductor package according to some embodiments.
Figure 1B:
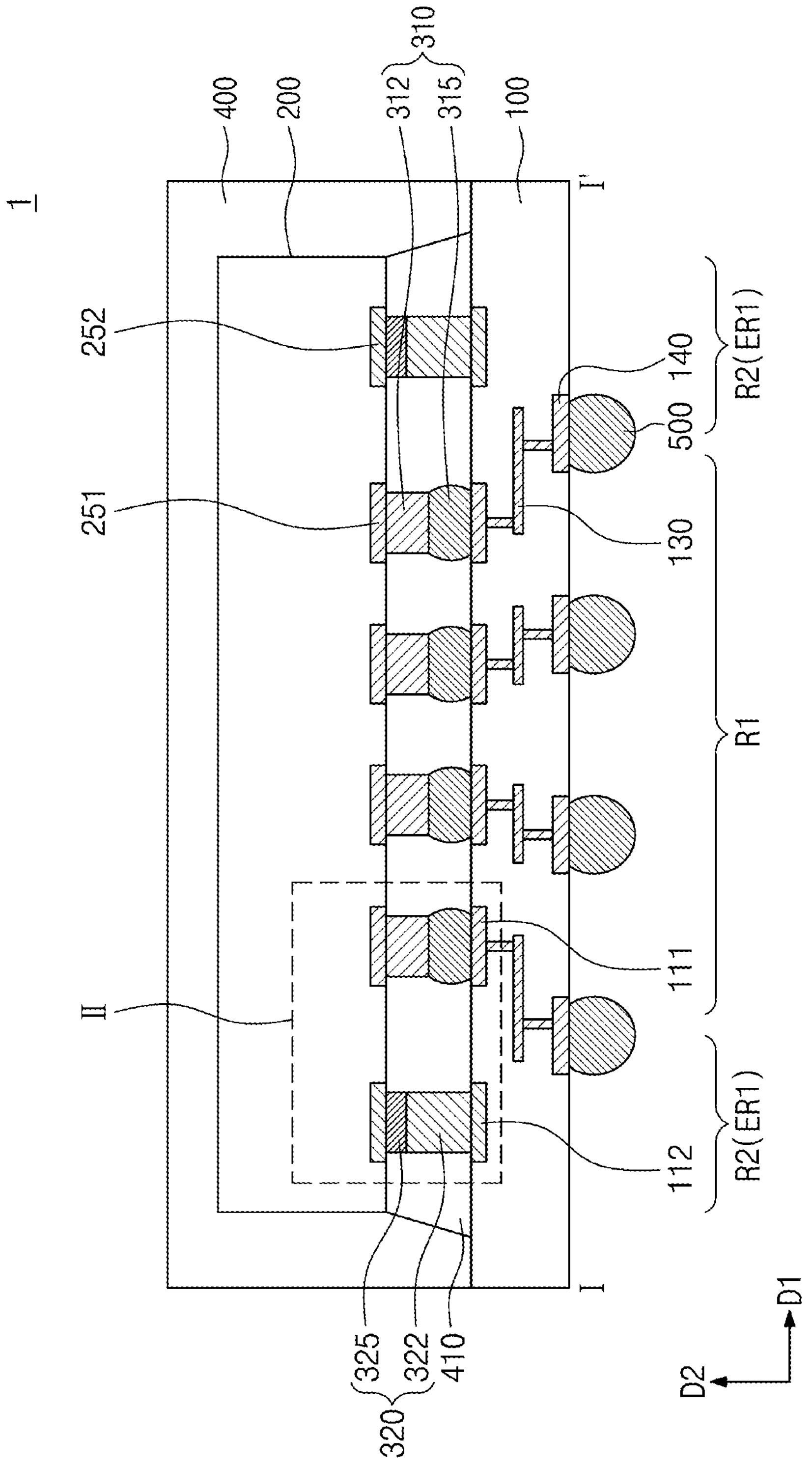
FIG. 1B illustrates a cross-sectional view taken along line I-I' of FIG. 1A.

FIG. 1A illustrates a plan view showing a semiconductor package according to some embodiments. FIG. 1B illustrates a cross-sectional view taken along line I-I' of FIG. 1A, and FIG. 1C illustrates an enlarged view showing section II of FIG. 1B.

Figure 1C:
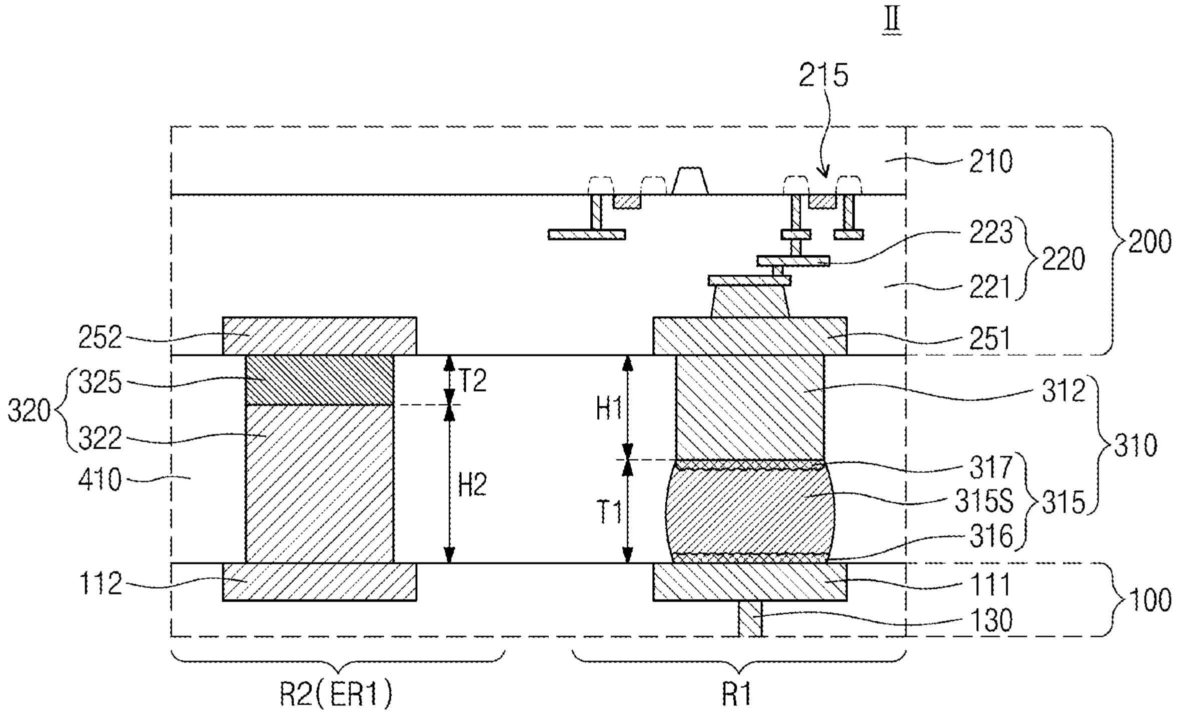
FIG. 1C illustrates an enlarged view showing section II of FIG. 1B.

Referring to FIGS. 1A, 1B, and 1C, a semiconductor package 1 may include a package substrate 100, solder balls 500, a semiconductor chip 200, connection bumps 310, dummy bumps 320, and a molding layer 400. The connection bumps 310 and the dummy bumps 320 may be between the package substrate 100 and the semiconductor chip 200 along a second direction D2, e.g., the second direction D2 may be perpendicular to a first direction D1.

The first direction D1 may be parallel to a top surface of the package substrate 100. The first direction D1 may be a diagonal direction, e.g., the first direction D1 may not be parallel to lateral surfaces of the package substrate 100. The second direction D2 may be substantially perpendicular to the top surface of the package substrate 100. The phrase "two components are laterally spaced apart from each other" means that "two components are horizontally spaced apart from each other." The term "horizontal" means being parallel to the top surface of the package substrate 100, e.g., the term "horizontal" may include the meaning of being parallel to the first direction D1. The term "perpendicular" means being parallel to the second direction D2.

The package substrate 100 may include, e.g., a printed circuit board (PCB). Alternatively, a redistribution layer may be used as the package substrate 100. The package substrate 100 may include connection substrate pads 111, dummy substrate pads 112, internal lines 130, and lower pads 140.

The lower pads 140 may be provided on a bottom surface of the package substrate 100. The lower pads 140 may serve as pads for the solder balls 500.

The internal lines 130 may be provided in the package substrate 100, thereby being coupled to the lower pads 140. The internal lines 130 and the lower pads 140 may include a conductive material, e.g., metal.

The connection substrate pads 111 may be provided on the top surface of the package substrate 100. The top surface of the package substrate 100 may stand opposite to the bottom surface of the package substrate 100, e.g., the top surface of the package substrate 100 may face the semiconductor chip 200. The connection substrate pads 111 may be electrically connected through the internal lines 130 to the lower pads 140. The phrase "electrically connected to a certain component" means being directly connected to a certain component or indirectly connected through other conductive component(s) to a certain component. The connection substrate pads 111 may include metal, e.g., one or more of copper, aluminum, and tungsten.

The dummy substrate pads 112 may be provided on the top surface of the package substrate 100 and may be disposed laterally spaced apart from the connection substrate pads 111, e.g., the dummy substrate pads 112 and the connection substrate pads 111 may overlap different portions of the top surface of the package substrate 100. The dummy substrate pads 112 may not be electrically connected to the internal lines 130 while being spaced apart from the internal lines 130. The dummy substrate pads 112 may not be electrically connected to the solder balls 500. The dummy substrate pads 112 may include metal, e.g., one or more of copper, aluminum, and tungsten. The dummy substrate pads 112 may include metal the same as or different from that of the connection substrate pads 111.

The solder balls 500 may be disposed on the bottom surface of the package substrate 100. For example, the solder balls 500 may be correspondingly disposed on bottom surfaces of the lower pads 140 and may be correspondingly coupled to the lower pads 140, e.g., in one-to-one correspondence. The solder balls 500 may be electrically connected to the connection substrate pads 111 and the dummy substrate pads 112. The solder balls 500 may be electrically separated from each other. The solder balls 500 may include a solder material. The solder material may include, e.g., tin, bismuth, lead, silver, or any alloy thereof.

The semiconductor chip 200 may be mounted on the top surface of the package substrate 100. When viewed in a plan view, as shown in FIG. 1A, the semiconductor chip 200 may have a first region R1 and a second region R2. The first region R1 and the second region R2 may be a central region and an edge region of the semiconductor chip 200, respectively. For example, the second region R2 of the semiconductor chip 200 may be provided between the first region R1 and sidewalls of the semiconductor chip 200. The second region R2 may surround, e.g., an entire perimeter of, the first region R1 of the semiconductor chip 200. The second region R2 may include first edge regions ER1 and second edge regions ER2 of the semiconductor chip 200. The semiconductor chip 200 may have corners where the lateral surfaces thereof meet each other. The first edge regions ER1 may be adjacent to the corners of the semiconductor chip 200. The second edge regions ER2 may be provided between the first edge regions ER1 of the semiconductor chip 200.

The semiconductor chip 200 may be, e.g., a memory chip, a logic chip, or a buffer chip. As shown in FIG. 1C, the semiconductor chip 200 may include a semiconductor substrate 210, integrated circuits 215, a wiring layer 220, dummy chip pads 252, and connection chip pads 251.

The semiconductor substrate 210 may include a semiconductor material, e.g., silicon, germanium, or silicon-germanium. The semiconductor substrate 210 may have a top surface that corresponds to that of the semiconductor chip 200.

The integrated circuits 215 may be provided on the bottom surface of the semiconductor substrate 210. The integrated circuits 215 may include, e.g., transistors.

The wiring layer 220 may be provided on the bottom surface of the semiconductor substrate 210, e.g., the wiring layer 220 may be between the bottom surface of the semiconductor substrate 210 and the package substrate 100. The wiring layer 220 may include a dielectric layer 221 and wiring structures 223. The dielectric layer 221 may be provided on the bottom surface of the semiconductor substrate 210, thereby covering the integrated circuits 215. The dielectric layer 221 may be a multiple layer. The dielectric layer 221 may include a silicon-containing dielectric material. The silicon-containing dielectric material may include, e.g., one or more of silicon oxide, silicon nitride, silicon oxynitride, and tetraethyl orthosilicate (TEOS). The wiring structures 223 may be provided in the dielectric layer 221. The wiring structures 223 may be electrically connected to the integrated circuits 215. The phrase "a certain component is electrically connected to the semiconductor chip 200" means that a certain component is electrically connected through the connection chip pads 251 of the semiconductor chip 200 to the integrated circuits 215 of the semiconductor chip 200. The wiring structures 223 may include wire parts and via parts connected to the wire parts. A bottom surface of the wiring layer 220 may be a bottom surface of the semiconductor chip 200.

The dummy chip pads 252 may be provided on the bottom surface at the second region R2 of the semiconductor chip 200. For example, the dummy chip pads 252 may be provided on the first edge regions ER1 of the semiconductor chip 200. The dummy chip pads 252 may include a first metal element. The first metal element may include one or more of, e.g., copper, aluminum, nickel, gold, and palladium. For example, as shown in FIG. 1A, the dummy chip pads 252 may have circular shapes. The dummy chip pads 252 may be electrically connected to neither the wiring structures 223 nor the integrated circuits 215.

The connection chip pads 251 may be provided on the bottom surface at the first region R1 of the semiconductor chip 200. The connection chip pads 251 may be disposed laterally spaced apart from the dummy chip pads 252. The connection chip pads 251 may be electrically connected through the wiring structures 223 to the integrated circuits 215. The connection chip pads 251 may be disposed spaced apart from each other. The connection chip pads 251 may include one or more of, e.g., copper, aluminum, palladium, nickel, and gold.

The connection bumps 310 may be interposed between the package substrate 100 and the first region R1 of the semiconductor chip 200. For example, the connection bumps 310 may be interposed between and electrically connected to the connection substrate pads 111 and the connection chip pads 251. Therefore, the semiconductor chip 200 may be electrically connected through the connection bumps 310 to the package substrate 100. For brevity of description, the following will discuss a single connection chip pad 251, a single dummy chip pad 252, a single connection substrate pad 111, and a single dummy substrate pad 112.

Each of the connection bumps 310 may include a connection pillar 312 and a connection solder pattern 315. The connection pillar 312 may be provided on a bottom surface of the connection chip pad 251 that corresponds thereto. The connection pillar 312 may have a cylindrical shape. The connection pillar 312 may include a metal element, e.g., copper or tungsten. The connection pillar 312 may have a first height H1.

The connection solder pattern 315 may be provided on a bottom surface of the connection pillar 312. The connection solder pattern 315 may be interposed between and electrically connected to the connection pillar 312 and the connection substrate pad 111.

The connection solder pattern 315 may include a first solder material. The first solder material may include one or more of, e.g., tin (Sn), silver (Ag), copper (Cu), manganese (Mg), lead (Pb), and any alloy thereof. A primary element of the first solder material may be, e.g., tin. A primary element of a certain component may have an amount greater than any other element present in the certain component. For example, the tin may have an amount of about 50 wt % of the first solder material, e.g., 50 wt % based on a total weight of the first solder material. The first solder material may have a melting point of about 210° C. to about 240° C.

The dummy bumps 320 may be provided between the package substrate 100 and the second region R2 of the semiconductor chip 200. For example, the dummy bumps 320 may be provided on the first edge regions ER1 of the semiconductor chip 200. The dummy bumps 320 may be interposed between the dummy substrate pads 112 and the dummy chip pads 252. As shown in FIG. 1A, the semiconductor chip 200 may include at least four dummy bumps 320, e.g., one dummy bump 320 may be positioned at each corner of the semiconductor chip 200.

Each of the dummy bumps 320 may include a dummy pillar 322 and a dummy solder pattern 325. The dummy pillar 322 may be provided on a top surface of the dummy substrate pad 112 that corresponds thereto. The dummy pillar 322 may have a cylindrical shape. For example, the dummy pillar 322 may have a circular shape when viewed in a plan view, as shown in FIG. 1A. The dummy pillar 322 may have a width less than that of the dummy chip pad 252, e.g., along the horizontal direction. The dummy pillar 322 may include a second metal element. For example, the second metal element may include copper or tungsten. The second metal element may be the same as or different from the first metal element.

The dummy solder pattern 325 may be provided on the dummy pillar 322. For example, the dummy solder pattern 325 may be interposed between the dummy pillar 322 and the dummy chip pad 252. The dummy solder pattern 325 may be in direct contact with the dummy pillar 322 and the dummy chip pad 252. The dummy solder pattern 325 may include an intermetallic compound (IMC). The dummy solder pattern 325 may be electrically connected to the dummy pillar 322 and the dummy chip pad 252.

With reference to FIG. 1C, the following will describe in detail the connection bump 310 and the dummy bump 320. In explaining FIG. 1C below, a single connection bump 310 and a single dummy bump 320 will be discussed in the interest of brevity.

The connection bump 310 may include the connection pillar 312 and the connection solder pattern 315. The connection solder pattern 315 may include a first intermetallic compound layer 316, a connection solder layer 315S, and a second intermetallic compound layer 317.

The first intermetallic compound layer 316 may be provided on a bottom surface of the connection solder layer 315S. The first intermetallic compound layer 316 may be in contact with the connection substrate pad 111 and the connection solder layer 315S. The first intermetallic compound layer 316 may include an intermetallic compound including, e.g., consisting of, the first solder material and metal contained in the connection substrate pad 111. The second intermetallic compound layer 317 may be provided on a top surface of the connection solder layer 315S. The second intermetallic compound layer 317 may be in contact with the connection solder layer 315S and the connection pillar 312. The second intermetallic compound layer 317 may include an intermetallic compound including, e.g., consisting of, the first solder material and metal contained in the connection pillar 312.

The connection solder layer 315S may be interposed between the first intermetallic compound layer 316 and the second intermetallic compound layer 317. The connection solder layer 315S may include the first solder material but may not include an intermetallic compound. For example, the connection solder layer 315S may be a remaining portion that is not formed into an intermetallic compound in a reflow process. The first solder material may be that discussed above. Therefore, the connection solder layer 315S may have a same melting point as that of the first solder material. The melting point of the connection solder layer 315S may range from about 210° C. to about 240° C. The melting point of the connection solder layer 315S may be lower than that of the first intermetallic compound layer 316 and that of the second intermetallic compound layer 317. The connection solder layer 315S may have a thickness greater than that of the first intermetallic compound layer 316 and that of the second intermetallic compound layer 317.

The connection solder pattern 315 may have a first thickness T1, e.g., along the second direction D2. The first thickness T1 may be the same as a sum of the thicknesses of the first intermetallic compound layer 316, the connection solder layer 315S, and the second intermetallic compound layer 317. The connection pillar 312 may have a first height H1, e.g., along the second direction D2. In some embodiments, the connection bump 310 may not include any of the first intermetallic compound layer 316 and the second intermetallic compound layer 317.

For brevity in figures other than FIG. 1C, there is no distinction between the first intermetallic compound layer 316, the connection solder layer 315S, and the second intermetallic compound layer 317. For brevity in figures other than FIG. 1C, there is no illustration of the semiconductor substrate 210, the integrated circuits 215, and the wiring layer 220.

The dummy bump 320 may include the dummy pillar 322 and the dummy solder pattern 325. The dummy pillar 322 may have a second height H2, e.g., along the second direction D2. The second height H2 may be greater than the first height H1.

The dummy solder pattern 325 may include an intermetallic compound including, e.g., consisting of, a second metal element contained in the dummy pillar 322, a first metal element contained in the dummy chip pad 252, and a second solder material. The intermetallic compound may be an alloy in which the first metal element, the second metal element, and the second solder material are combined with each other at a certain stoichiometric ratio. The intermetallic compound may have physical chemical properties different from those of the first metal element, the second metal element, and the second solder material. The dummy solder pattern 325 may not include the second solder material that does not participate in the formation of the intermetallic compound. The second solder material may be different from the first solder material. The second solder material may include one or more of, e.g., bismuth (Bi), indium (In), and any alloy thereof. A primary element of the second solder material may include, e.g., bismuth (Bi) or indium (In). For example, a content ratio of bismuth or indium may be equal to or greater than about 20 wt % of the second solder material. The content ratio of bismuth or indium may be equal to or greater than about 20 wt % of the dummy solder pattern 325.

The dummy solder pattern 325 may have a melting point substantially the same as that of an intermetallic compound including, e.g., consisting of, the first metal element, the second metal element, and the second solder material. The dummy solder pattern 325 may include the intermetallic compound and may have a relatively high melting point. The melting point of the dummy solder pattern 325 may be higher than that of the connection solder pattern 315. The melting point of the dummy solder pattern 325 may be equal to or higher than about 270° C. For example, the melting point of the dummy solder pattern 325 may range from about 270° C. to about 3,000° C.

The dummy solder pattern 325 may have a second thickness T2, e.g., along the second direction D2. The second thickness T2 may be less than, e.g., each of, the first thickness T1 and the second height H2. For example, the second thickness T2 may range from about 5 μm to about 10 μm.

A sum of the second thickness T2 and the second height H2 may be substantially the same as a sum of the first thickness T1 and the first height H1. The phrase "certain components are the same in terms of width, height, and level" may include an allowable tolerance possibly occurring during fabrication process.

Referring back to FIG. 1B, the semiconductor package 1 may further include an under-fill layer 410. The under-fill layer 410 may be provided in a gap between the package substrate 100 and the semiconductor chip 200, thereby encapsulating the dummy bumps 320 and the connection bumps 310. The under-fill layer 410 may include a dielectric polymer, e.g., an epoxy-based polymer.

The molding layer 400 may be provided on the top surface of the package substrate 100, thereby covering the semiconductor chip 200. The molding layer 400 may include a dielectric polymer, e.g., an epoxy-based molding compound. Alternatively, the under-fill layer 410 may be omitted, and the molding layer 400 may further extend between the package substrate 100 and the semiconductor chip 200 to encapsulate the dummy bumps 320 and the connection bumps 310.

Figure 2A:
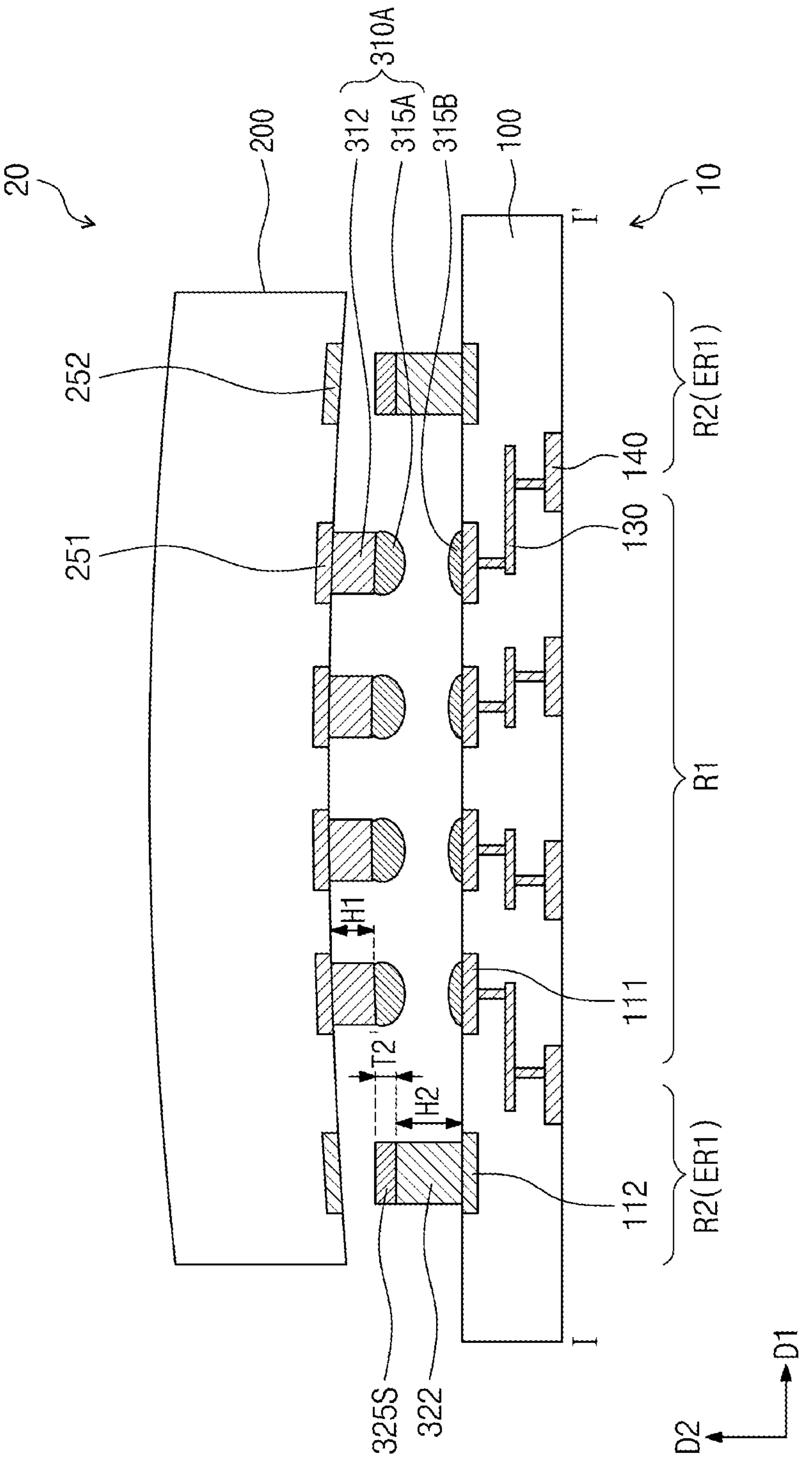
FIGS. 2A to 2G illustrate cross-sectional views of stages in a method of fabricating a semiconductor package according to some embodiments.
Figure 2B:
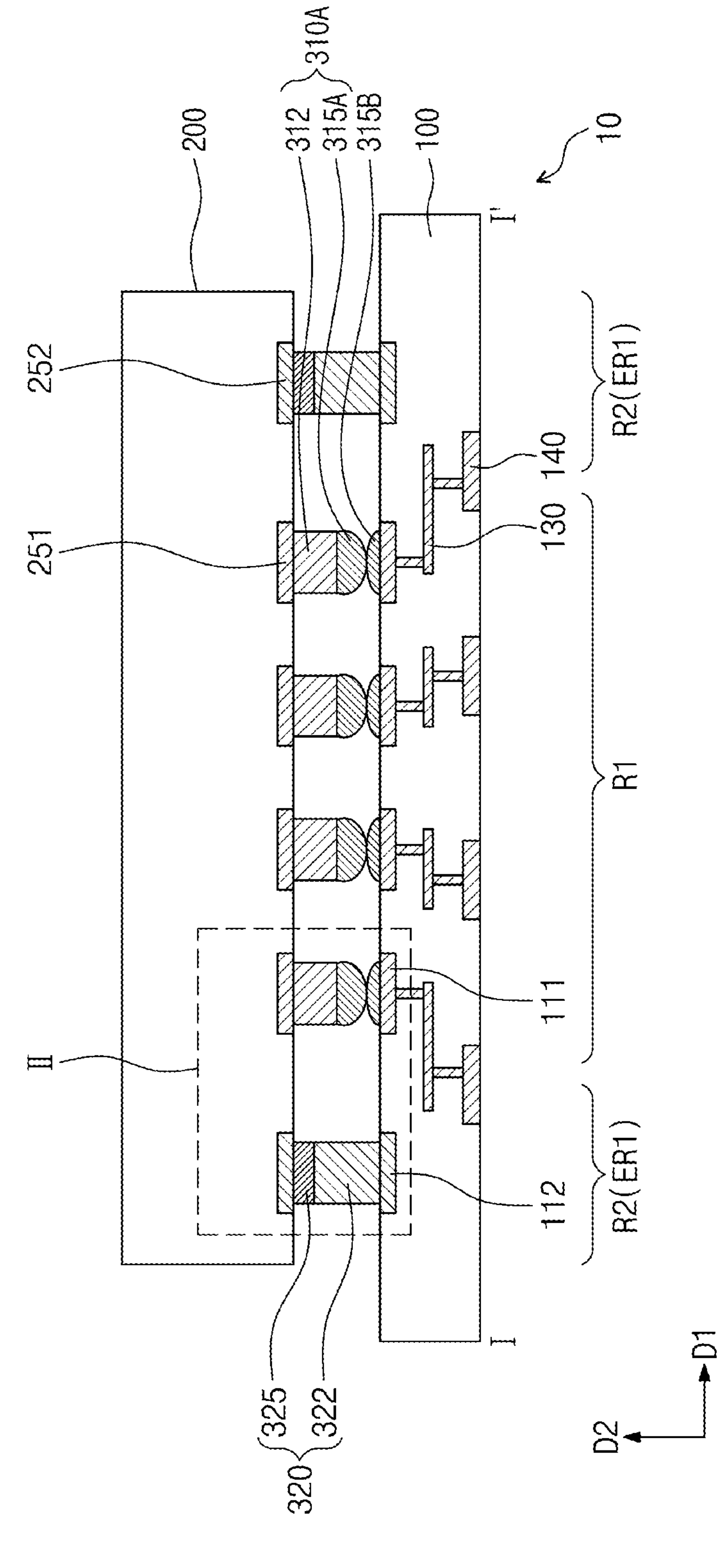
Figure 2C:
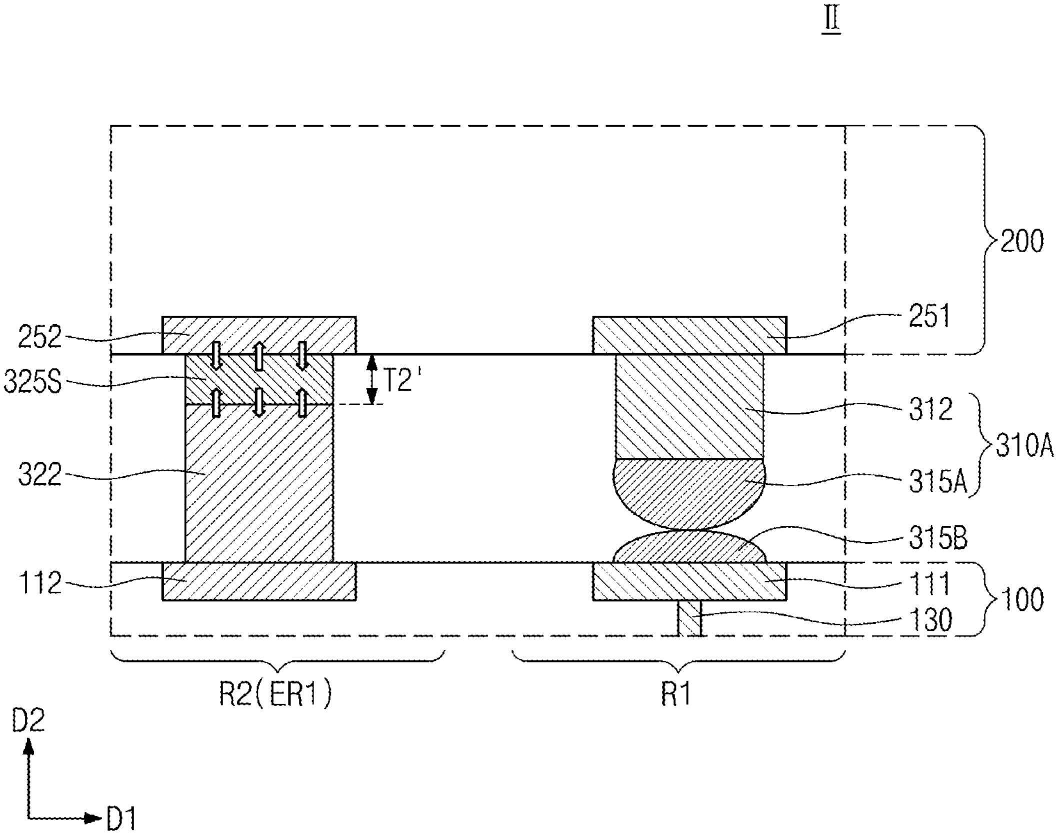
Figure 2D:
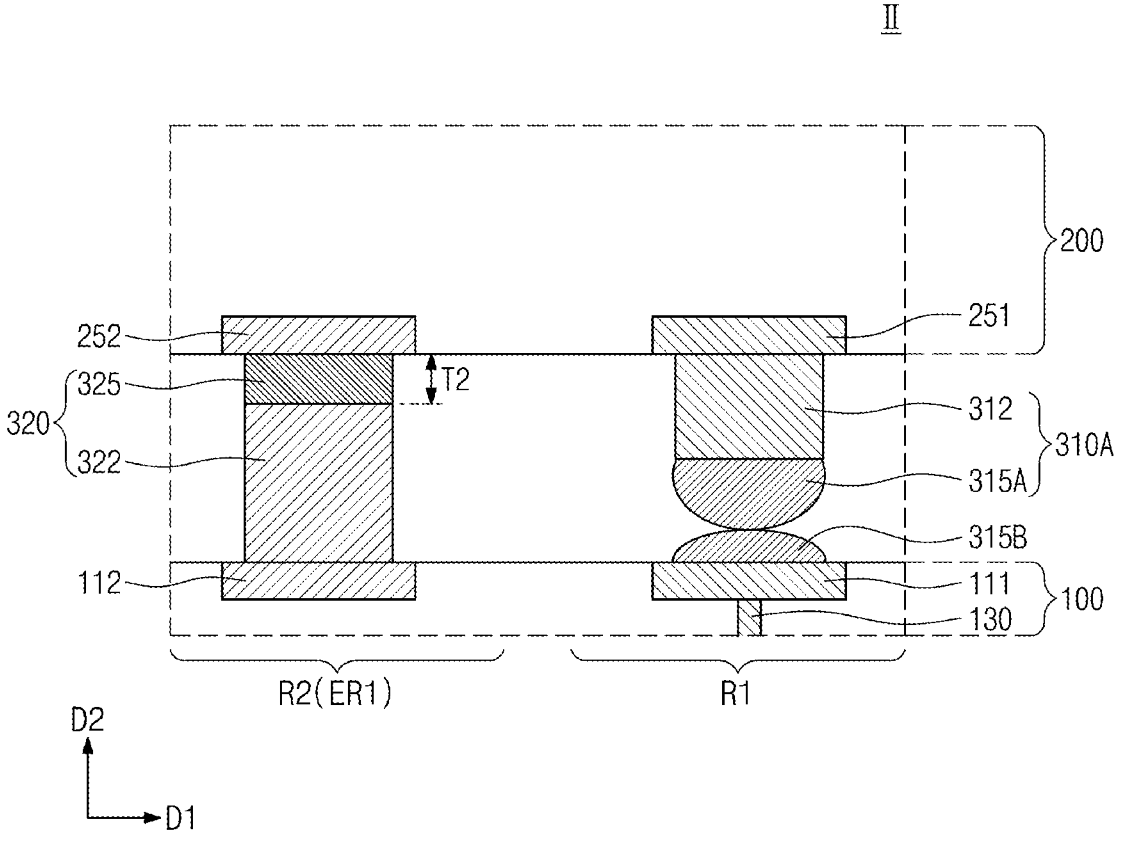
Figure 2E:
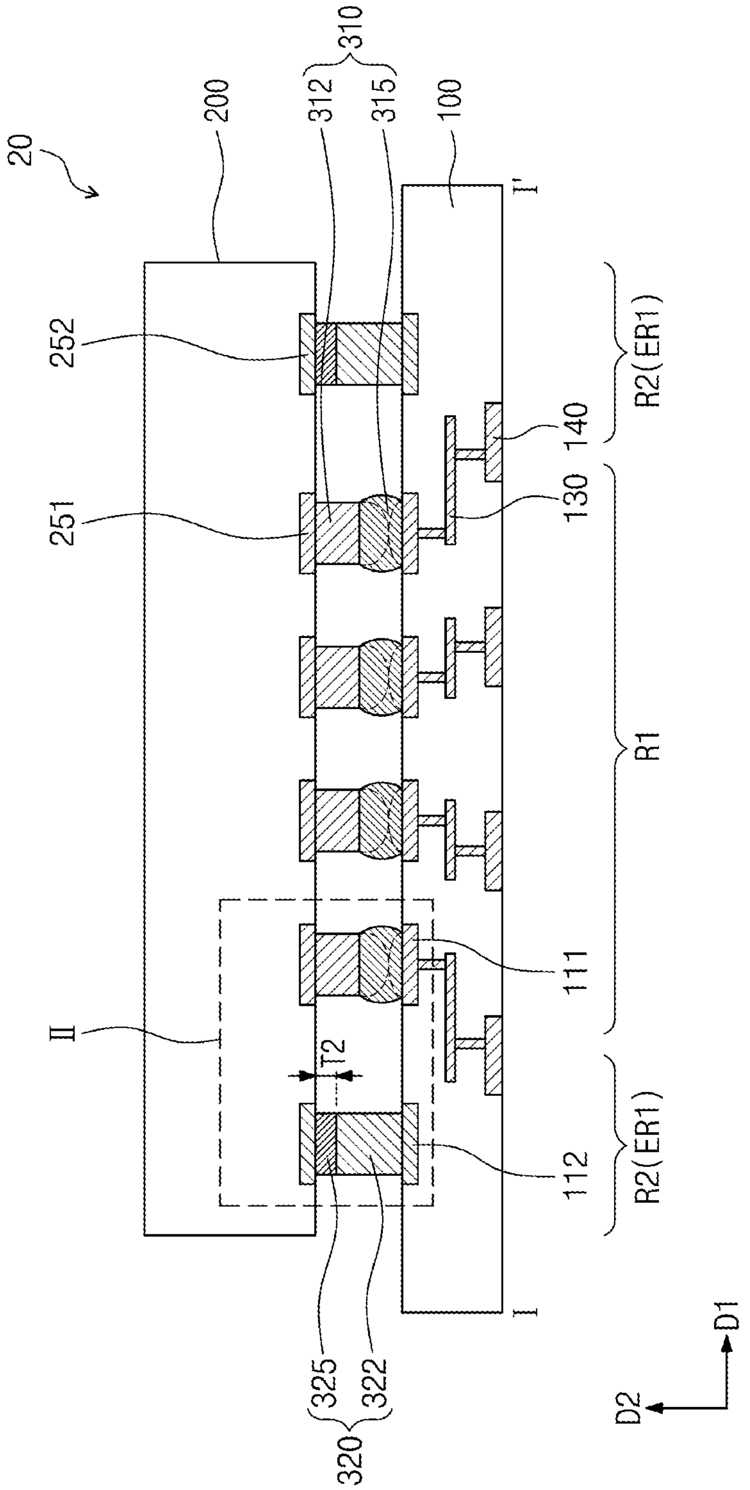
Figure 2F:
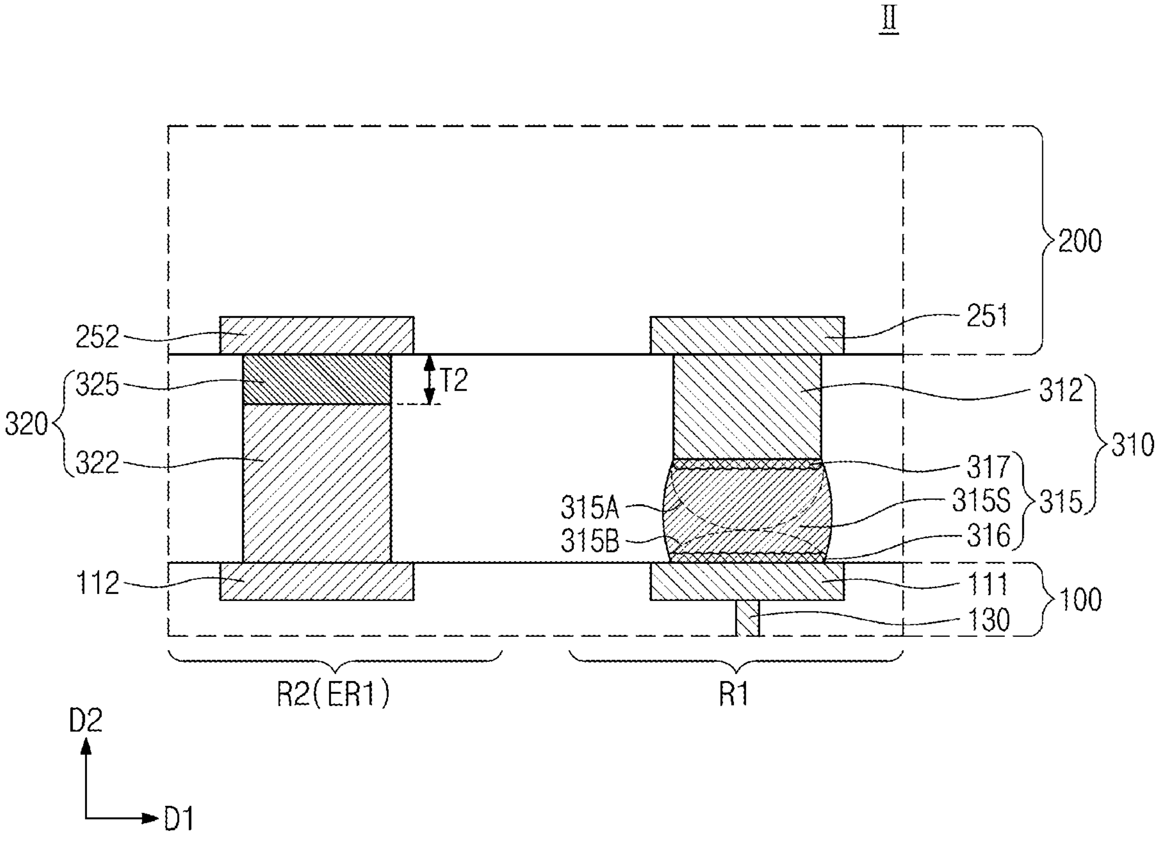

FIGS. 2A to 2G illustrate cross-sectional views showing stages in a method of fabricating a semiconductor package according to some embodiments. FIGS. 2A, 2B, 2E, and 2G show cross-sectional views taken along line I-I' of FIG. 1A. FIGS. 2C, 2D, and 2F depict enlarged views of section II of FIGS. 2B and 2E. A duplicate description will be omitted below.

Referring to FIG. 2A, a semiconductor device 20 may be provided on a substrate structure 10. The substrate structure 10 may include the package substrate 100, a first connection solder part 315B, a dummy pillar 322, and a dummy solder part 325S. The package substrate 100 and the dummy pillar 322 may be substantially the same as those discussed above in the examples of FIGS. 1A to 1C.

For example, the first connection solder part 315B may be provided on the connection substrate pad 111. The first connection solder part 315B may include a first solder material.

The dummy pillar 322 may be disposed on the dummy substrate pad 112. The dummy solder part 325S may be provided on the dummy pillar 322. The dummy solder part 325S may have a thickness T2' substantially the same as the second thickness T2 of the dummy solder pattern 325 shown in FIGS. 1A to 1C. For example, the thickness T2' of the dummy solder part 325S may range from about 5 μm to about 10 μm.

The dummy solder part 325S may include a second solder material that does not participate in the formation of an intermetallic compound. The second solder material may be different from the first solder material. The dummy solder part 325S may have a melting point lower than that of the first connection solder part 315B. The melting point of the dummy solder part 325S may be lower than about 210° C. For example, the melting point of the dummy solder part 325S may range from about 100° C. to about 180° C. The dummy solder part 325S may include an indium-based solder material or a bismuth-based solder material.

The semiconductor device 20 may include the semiconductor chip 200 and a conductive connection bump 310A.

The semiconductor chip 200 may be substantially the same as that discussed in the examples of FIGS. 1A to 1C. For example, the semiconductor chip 200 may include the dummy chip pad 252 and the connection chip pad 251. The semiconductor chip 200 may bend, e.g., the semiconductor chip 200 may be flexible and have a bent shape. The conductive connection bump 310A may be provided on a bottom surface of the connection chip pad 251. The conductive connection bump 310A may include the connection pillar 312 and a second connection solder part 325A. The second connection solder part 325A may include the first solder material. The melting point of the dummy solder part 325S may be lower than that of the second connection solder part 325A. A sum of thicknesses of the first and second connection solder parts 315B and 315A may be greater than a first thickness (see T1 of FIG. 1C).

The connection pillar 312 may be substantially the same as the connection pillar 312 of FIGS. 1A to 1C. For example, the first height H1 of the connection pillar 312 may be less than the second height H2 of the dummy pillar 322.

The semiconductor chip 200 may be placed on a top surface of the package substrate 100. The placement of the semiconductor device 20 may be performed at room temperature (e.g., about 27° C.). The semiconductor chip 200 may have a curved shape, e.g., a crying face shape, at room temperature. For example, the semiconductor chip 200 may have an upwardly convex shape when viewed in cross section, e.g., a center of the semiconductor chip 200 may curve (e.g., bulge) out in an upward direction away from the package substrate 100 to define a convex shape in a cross section. A bottom surface at the second region R2 of the semiconductor chip 200 may be located at a lower level than that of a bottom surface at the first region R1 of the semiconductor chip 200. A level of a certain component may indicate a vertical level, e.g., a vertical distance along the second direction D2 relative to a bottom of the package substrate 100. A difference in level between two components may be measured in the second direction D2. The conductive connection bump 310A and the dummy chip pad 252 may be vertically aligned with the first connection solder part 315B and the dummy solder part 325S, respectively.

Referring to FIG. 2B, the semiconductor device 20 and the substrate structure 10 may be provided under conditions of a first temperature, and the dummy bump 320 may be formed. The first temperature may be lower than the melting point of each of the first and second connection solder parts 315B and 315A. The first temperature may range from about 130° C. to about 190° C. The semiconductor chip 200 may have a shape that depends on a temperature condition and a difference in coefficient of thermal expansion (CTE) of components included in the semiconductor chip 200. The semiconductor chip 200 under conditions of the first temperature may have a shape different from that of the semiconductor chip 200 at room temperature. Under conditions of the first temperature, the semiconductor chip 200 may have top and bottom surfaces that are substantially flat. For example, the top and bottom surfaces of the semiconductor chip 200 may be substantially parallel to the first direction D1.

The first temperature may be higher than the melting point of the dummy solder part 325S. Therefore, the dummy solder part 325S may be melted. A transient liquid phase bonding process may be used to allow the dummy solder part 325S to convert into the dummy solder pattern 325. The transient liquid phase bonding may be a transient liquid phase diffusion connection. The dummy solder pattern 325 may be bonded to the dummy chip pad 252 and the dummy pillar 322. With reference to FIGS. 2C and 2D, the following will describe the formation of the dummy solder pattern 325.

FIGS. 2C and 2D illustrate enlarged views of section II depicted in FIG. 2B, showing the formation of a dummy solder pattern according to some embodiments.

Referring to FIG. 2C, the dummy solder part 325S may be melted under conditions of the first temperature. The second solder material in the dummy solder part 325S may be in a liquid state. The second solder material may migrate into the dummy chip pad 252 and the dummy pillar 322. The second solder material may react with a first metal element in the dummy chip pad 252 and with a second metal element in the dummy pillar 322. The first metal element in the dummy chip pad 252 may migrate into the dummy solder part 325S to react with the second solder material. The second metal element in the dummy pillar 322 may migrate into the dummy solder part 325S to react with the second solder material. The reactions mentioned above may form an intermetallic compound.

Referring to FIG. 2D, the transient liquid phase bonding process may be continuously performed such that the dummy solder part 325S may not include the second solder material which does not participate in the formation of the intermetallic compound. For example, the second solder material may react with the first metal element and the second metal element to form an intermetallic compound including, e.g., consisting of, the first metal element, the second metal element, and the second solder material. The intermetallic compound may have a melting point higher than the first temperature. Therefore, it may be possible to form the dummy solder pattern 325 in a solid state.

When the dummy solder part 325S has a thickness (see T2' of FIG. 2C) equal to or greater than about 10 μm, the second solder material may not be completely converted into the intermetallic compound. An intermetallic compound included in the dummy solder pattern 325 may not be the intermetallic compound including, e.g., consisting of, the first metal element, the second metal element, and the second solder material. For example, a portion of the second solder material may remain in the dummy solder pattern 325, and the dummy solder pattern 325 may include an intermetallic compound including, e.g., consisting of, the first metal element and the second solder material and/or an intermetallic compound including, e.g., consisting of, the second metal element and the second solder material. In this case, because the second solder material is in a liquid state in a reflow process which will be discussed below, it may be difficult to fix the semiconductor chip 200 to the package substrate 100.

The first and second connection solder parts 315B and 315A may have their melting points higher than the first temperature. During the transient liquid phase bonding process, the first and second connection solder parts 315B and 315A may not be bonded to each other.

Referring to FIGS. 2E and 2F, the first and second connection solder parts 315B and 315A may undergo a reflow process to form connection bumps 310. The reflow process may be performed at a second temperature higher than the first temperature. The second temperature may be the same as or higher than a melting point of the first solder material. For example, the second temperature may range from about 240° C. to about 260° C. The first connection solder part 315B and the second connection solder part 315A may be bonded to each other to form the connection solder pattern 315. Therefore, the connection bump 310 may be eventually fabricated which includes the connection pillar 312 and the connection solder pattern 315.

In a procedure for forming the connection solder pattern 315, a metal element in the connection pillar 312 may migrate into the second connection solder part 315A to react with the second solder material. Therefore, the second intermetallic compound layer 317 may be formed. A metal element in the connection substrate pad 111 may migrate into the first connection solder part 315B to react with the first solder material. Therefore, the first intermetallic compound layer 316 may be formed. The connection solder layer 315S may be interposed between the first intermetallic compound layer 316 and the second intermetallic compound layer 317. A portion of the first solder material may not be formed into an intermetallic compound, but may remain to form the connection solder pattern 315.

Figure 3:
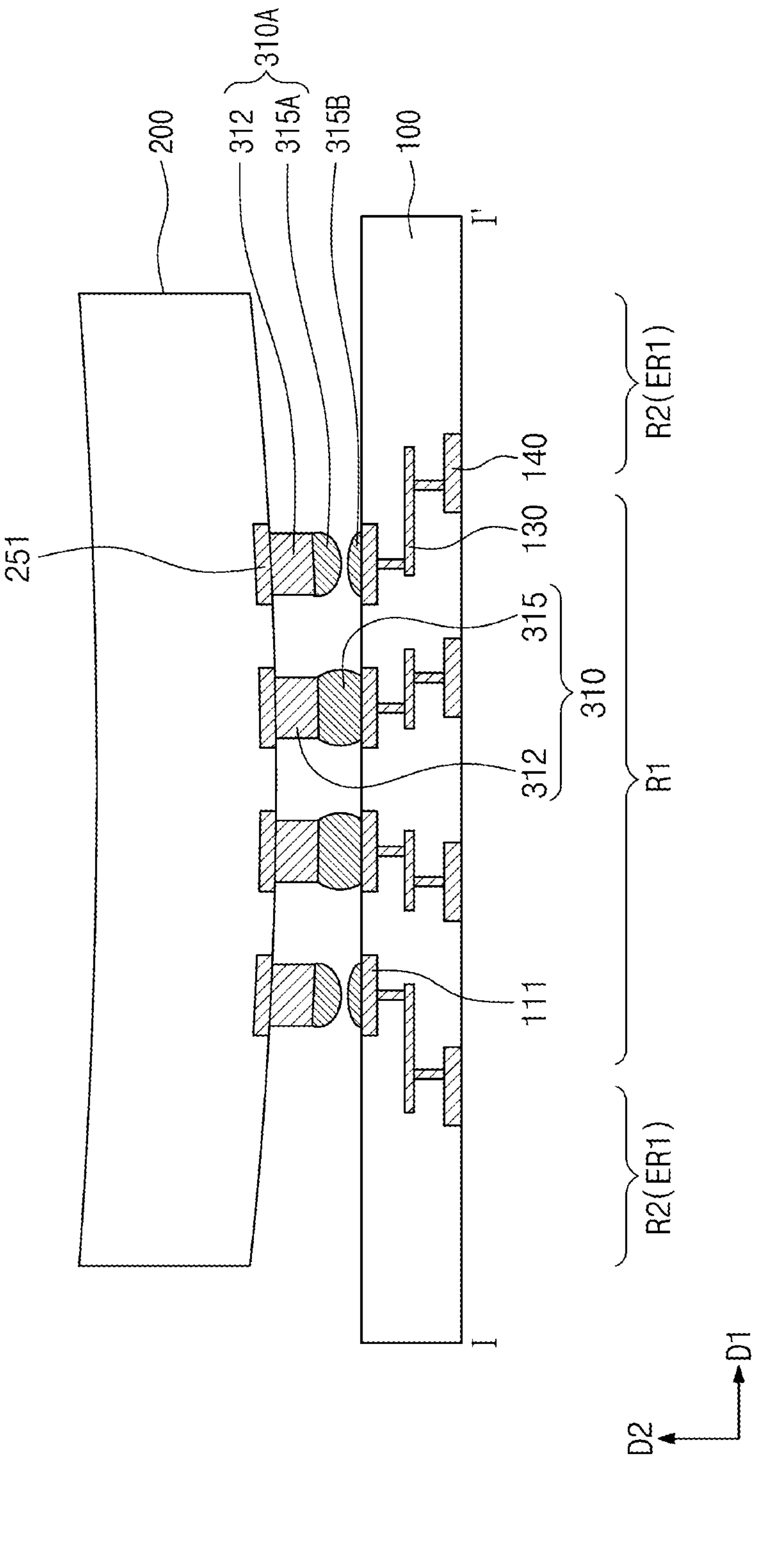
FIG. 3 illustrates a cross-sectional view showing an example of a reflow process.

FIG. 3 illustrates a cross-sectional view showing an example of a reflow process.

Referring to FIG. 3, if the dummy bump 320 were not formed (i.e., if the transient liquid phase bonding process of FIGS. 2B-2D were to be omitted), only the connection bump 310 would have been formed via a reflow process at the second temperature, as was discussed above in FIGS. 2E and 2F. However, under conditions of the second temperature, the semiconductor chip 200 would have experienced warpage, e.g., edges of the semiconductor chip 200 would have lifted upward to have non-flat surfaces in a cross section, so at least one outermost first connection solder part 315B and at least one outermost second connection solder part 315A would not have been able to contact each other, thereby failing to bond to each other. Therefore, a poor electrical connection would have occurred between the semiconductor chip 200 and the package substrate 100 without the dummy bumps 320.

In contrast, according to example embodiments, the dummy bump 320 are formed via the transient liquid phase bonding process under conditions of the first temperature (which is lower than the second temperature required for reflow), so the second solder material included in the dummy solder part 325S may be formed into the dummy solder pattern 325 (which includes an intermetallic compound with an extremely high melting point). Therefore, the dummy bump 320 secures a connection between edges of the semiconductor chip 200 and the package substrate 100 during a subsequent reflow process even at high temperatures, due to the high melting point of the resultant intermetallic compound in the dummy solder pattern 325.

Referring back to FIGS. 2E and 2F, the reflow process may be performed under conditions of the second temperature. Because the melting point of the dummy solder pattern 325 is higher than the second temperature, the dummy solder pattern 325 may be in a solid state in the reflow process. Therefore, the dummy solder pattern 325 may stably fix the first edge region ER1 of the semiconductor chip 200 to the package substrate 100. In addition, because the dummy solder pattern 325 includes the intermetallic compound, an extremely strong bonding force may be provided between the dummy solder pattern 325 and the dummy pillar 322 and between the dummy solder pattern 325 and the dummy chip pad 252. For example, a significantly large bonding force may be provided between the dummy bump 320 and the package substrate 100 and between the dummy bump 320 and the semiconductor chip 200.

In detail, as warpage (discussed with reference to FIG. 3) may be concentrated at an edge region of the semiconductor chip 200, e.g., the first edge regions ER1 of the semiconductor chip 200, the semiconductor chip 200 may include at least four dummy bumps 320, e.g., one dummy bump 320 at each corner of the semiconductor chip 200. The dummy bumps 320 may be correspondingly provided on the first edge regions ER1 of the semiconductor chip 200, and thus under conditions of the second temperature, warpage may be prevented or substantially minimized from occurring in the semiconductor chip 200. Therefore, boding may not be prevented between the outermost first connection solder part 315B and the outermost second connection solder part 315A. The first connection solder part 315B and the second connection solder part 315A may be satisfactorily bonded to each other to form the connection bump 310. A plurality of connection bumps 310 may be formed. Therefore, the semiconductor chip 200 may be favorably electrically connected to the package substrate 100, and the occurrence of defects (e.g., bonding failure) may be prevented during fabrication process for the semiconductor package 1. The semiconductor package 1 may increase in yield during the fabrication process.

When the second thickness T2 of the dummy solder pattern 325 is less than about 5 μm, a reduced bonding force may be provided between the dummy solder pattern 325 and the semiconductor chip 200, and between the dummy solder pattern 325 and the package substrate 100. In this case, during the reflow process, it may be difficult for the dummy solder pattern 325 to prevent the warpage of the semiconductor package 1. When the second thickness T2 of the dummy solder pattern 325 is greater than about 10 μm, the dummy solder part 325S of FIG. 2A may not be completely converted into the dummy solder pattern 325 (e.g., the dummy solder part 325S may remain in the dummy bump 320), so the dummy solder part 325S may be in a liquid state in the reflow process, and it may be difficult to fix the semiconductor chip 200 to the package substrate 100.

According to some embodiments, because the second thickness T2 is in a range of about 5 μm to about 10 μm, the dummy solder pattern 325 may stably fix the semiconductor chip 200 to the package substrate 100. Accordingly, it may be possible to satisfactorily bond the first and second connection solder parts 315B and 315A to each other and to prevent failure during the fabrication process of the semiconductor package 1.

Figure 2G:
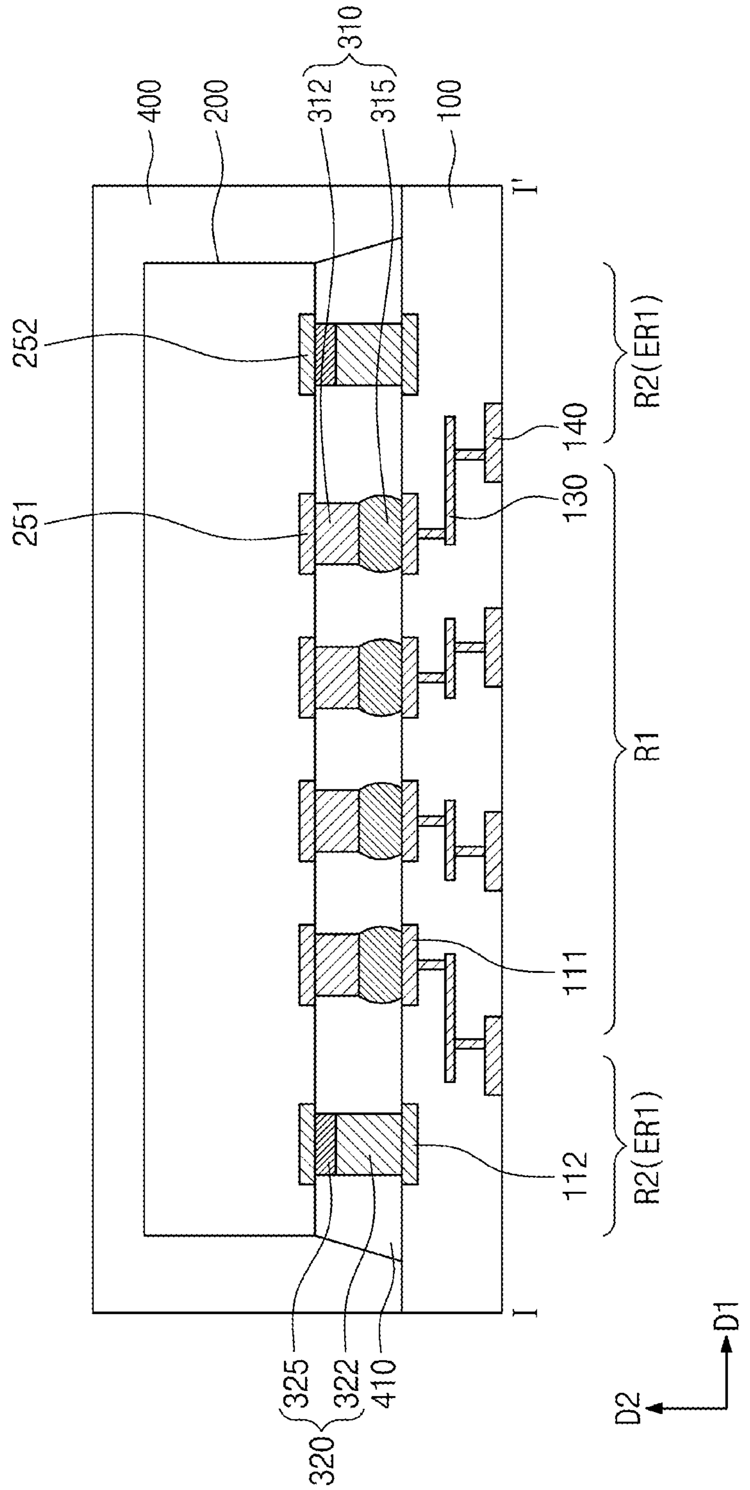

Referring to FIG. 2G, the under-fill layer 410 may be formed in a gap between the package substrate 100 and the semiconductor chip 200, thereby encapsulating the dummy bumps 320 and the connection bumps 310. The molding layer 400 may be formed on the package substrate 100, thereby covering the semiconductor chip 200.

Referring back to FIG. 1B, the solder balls 500 may be formed on bottom surfaces of the lower pads 140. Accordingly, the semiconductor package 1 may be finalized.

The following will discuss a single semiconductor package 1 for brevity of description, but a method of fabricating a semiconductor package is not limited to a chip-level fabrication. An arrangement of dummy pillars will be discussed in detail according to some embodiments.

FIGS. 4A, 4B, 4D, 4E, and 4F illustrate plan views showing a semiconductor package according to some embodiments. FIG. 4C illustrates a cross-sectional view taken along line I-I' of FIG. 4B.

Referring to FIGS. 4A, 4B, 4D, 4E, and 4F, the dummy pillar 322 may be variously changed in terms of planar shape or arrangement, e.g., as viewed in a top view. The dummy chip pad 252 and the dummy solder pattern (see 325 of FIG. 1B) may overlap the dummy pillar 322, e.g., as viewed in a top view. The dummy pillar 322 may be provided in plural.

Figure 4A:
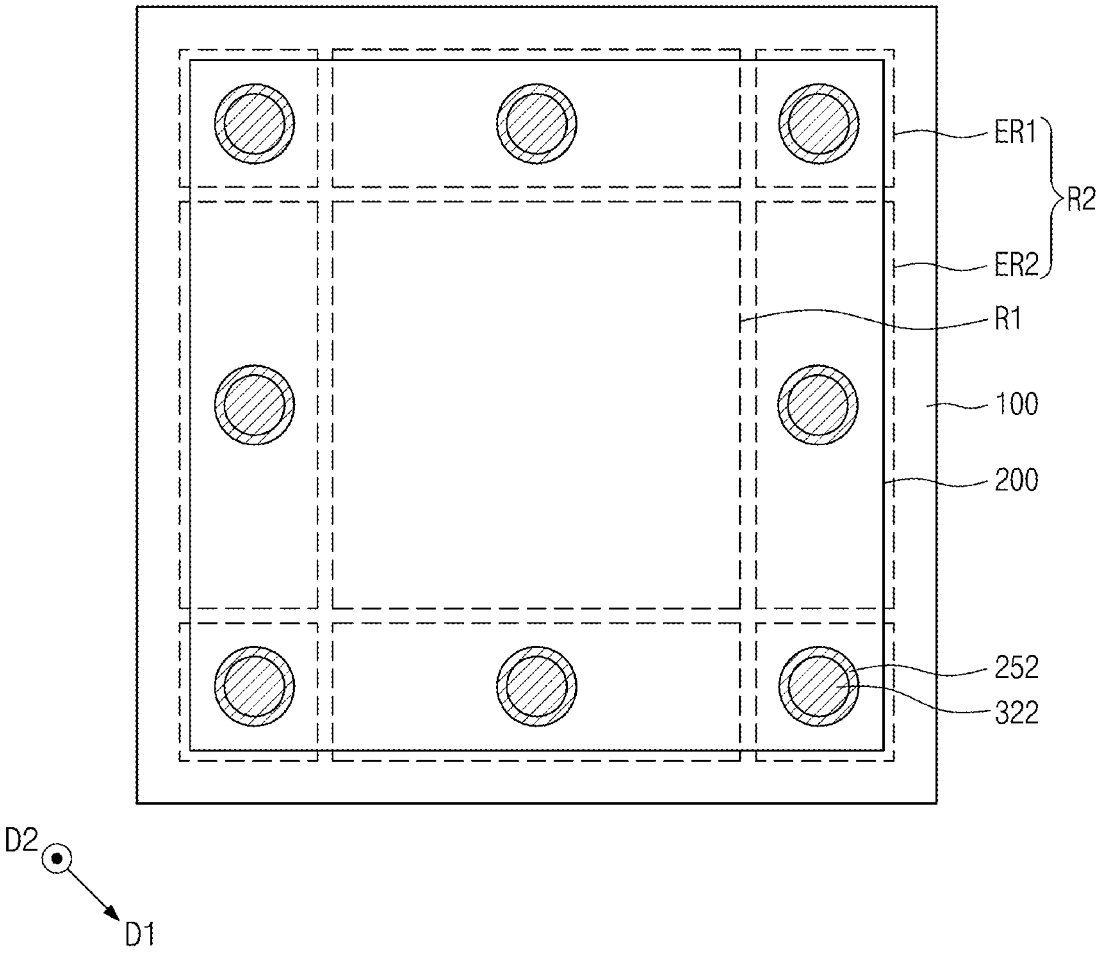
FIG. 4A illustrates a plan view showing a semiconductor package according to some embodiments.

As shown in FIG. 4A, the dummy pillars 322 may be disposed on the first edge region ER1 and the second edge region ER2 of the semiconductor chip 200. For example, as illustrated in FIG. 4A, the dummy pillars 322 may be positioned both at corners of the semiconductor chip 200 (i.e., at the first edge region ER1) and along the linear edge of the semiconductor chip 200 extending between corners (i.e., second edge region ER2).

Figure 4B:
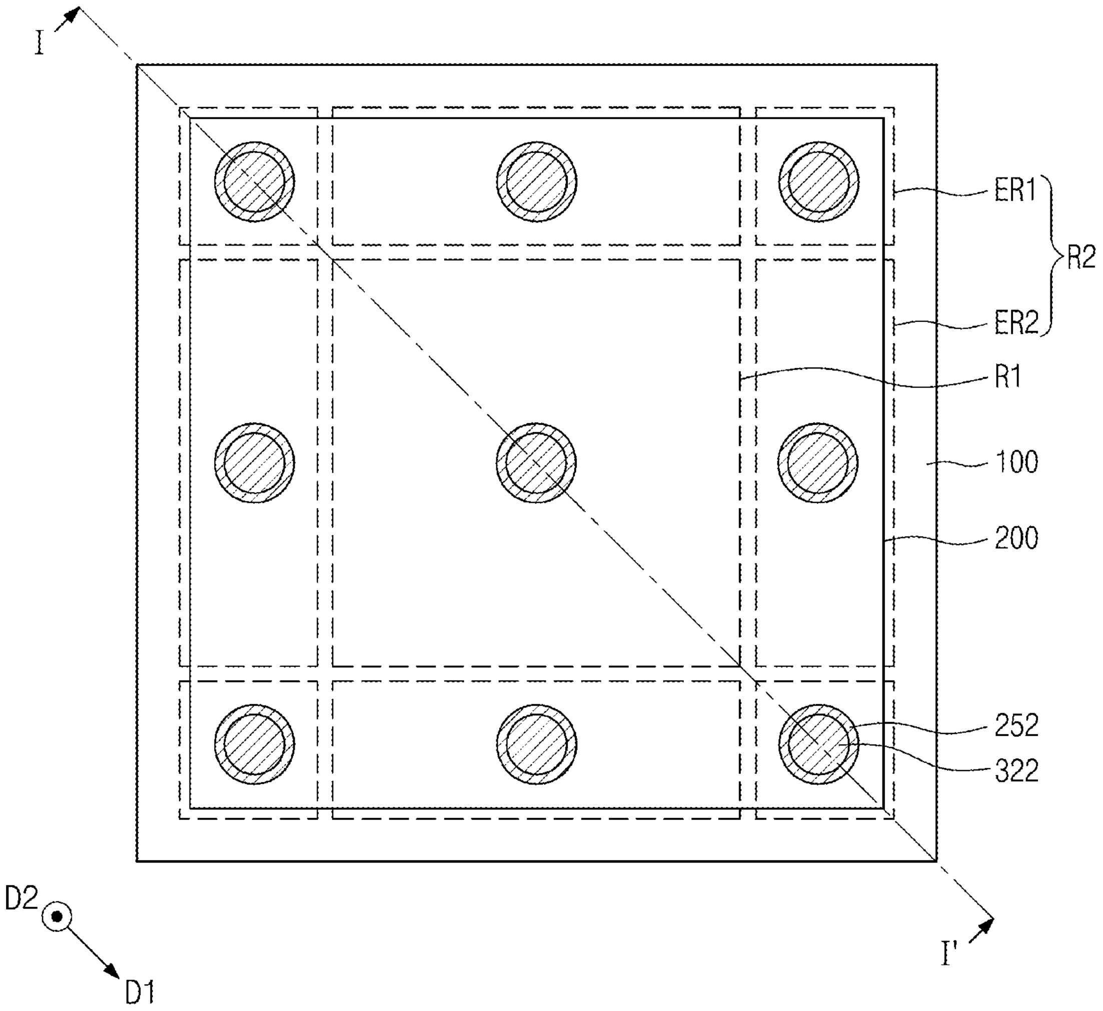
FIG. 4B illustrates a plan view showing a semiconductor package according to some embodiments.
Figure 4C:
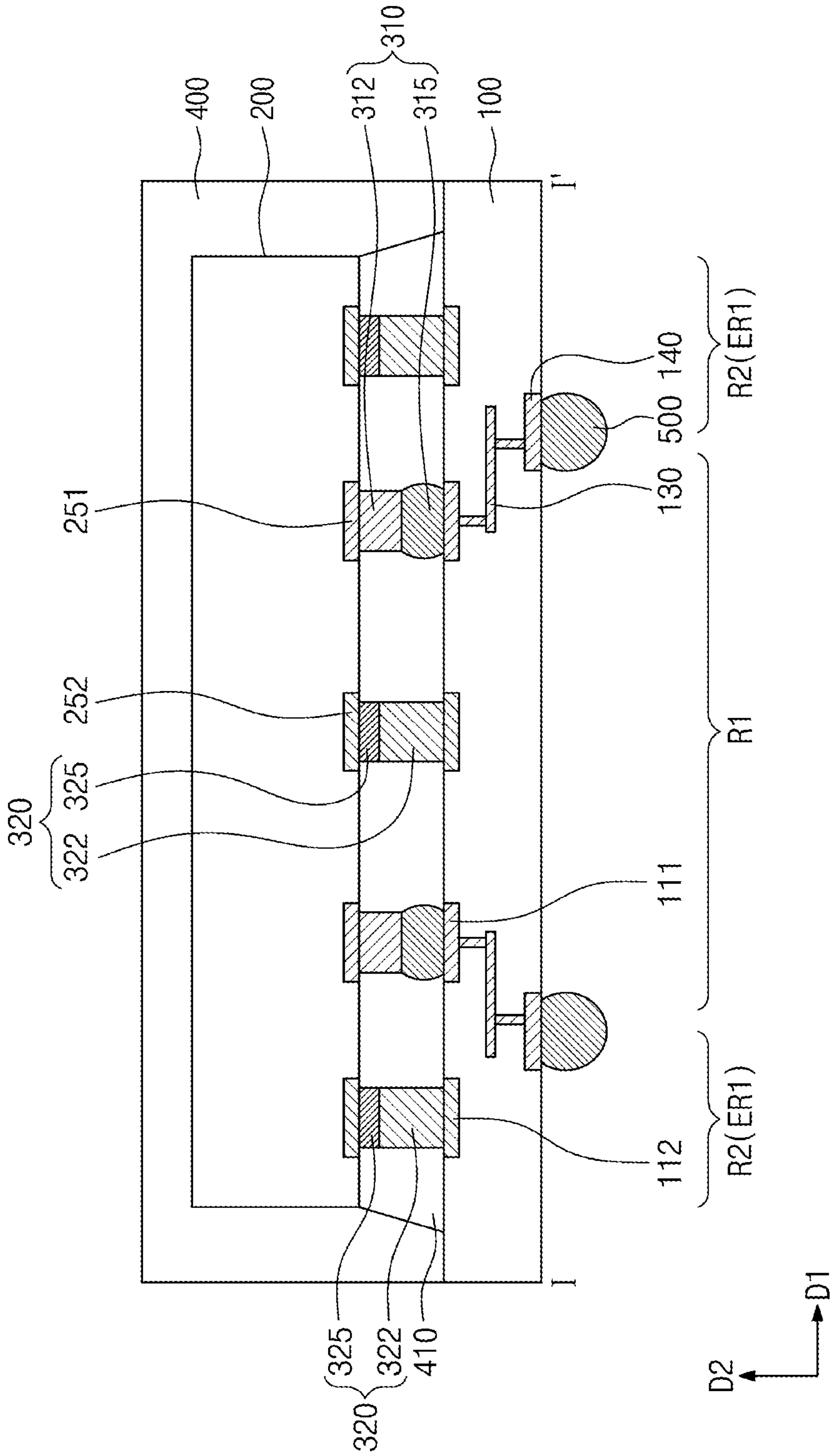
FIG. 4C illustrates a cross-sectional view taken along line I-I' of FIG. 4B.

As shown in FIGS. 4B and 4C, the dummy pillars 322 may be disposed on the first region R1 and the second region R2 of the semiconductor chip 200. For example, as illustrated in FIG. 4B, the dummy pillars 322 may be positioned at corners of the semiconductor chip 200 (i.e., at the first edge region ER1), along the linear edge of the semiconductor chip 200 extending between corners (i.e., second edge region ER2), and I a central region of the semiconductor chip 200 (i.e., in the first region R1).

Figure 4D:
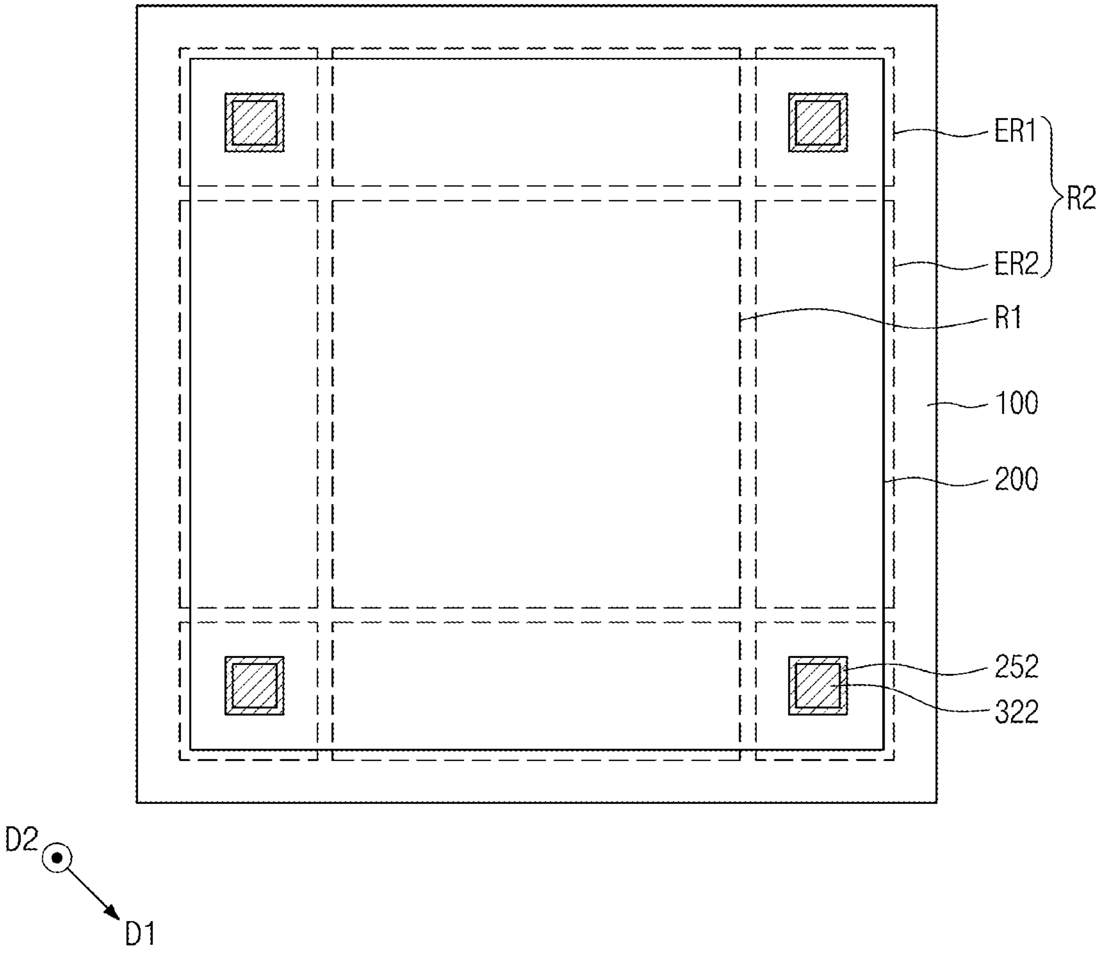
FIG. 4D illustrates a cross-sectional view showing a semiconductor package according to some embodiments.

As shown in FIG. 4D, the dummy pillars 322 may each have a polygonal shape when viewed in plan. For example, the dummy pillars 322 may each have a tetragonal shape. In another example, when viewed in plan, the dummy pillars 322 may each have a hexagonal shape, an octagonal shape, or any other suitable shape.

Figure 4E:
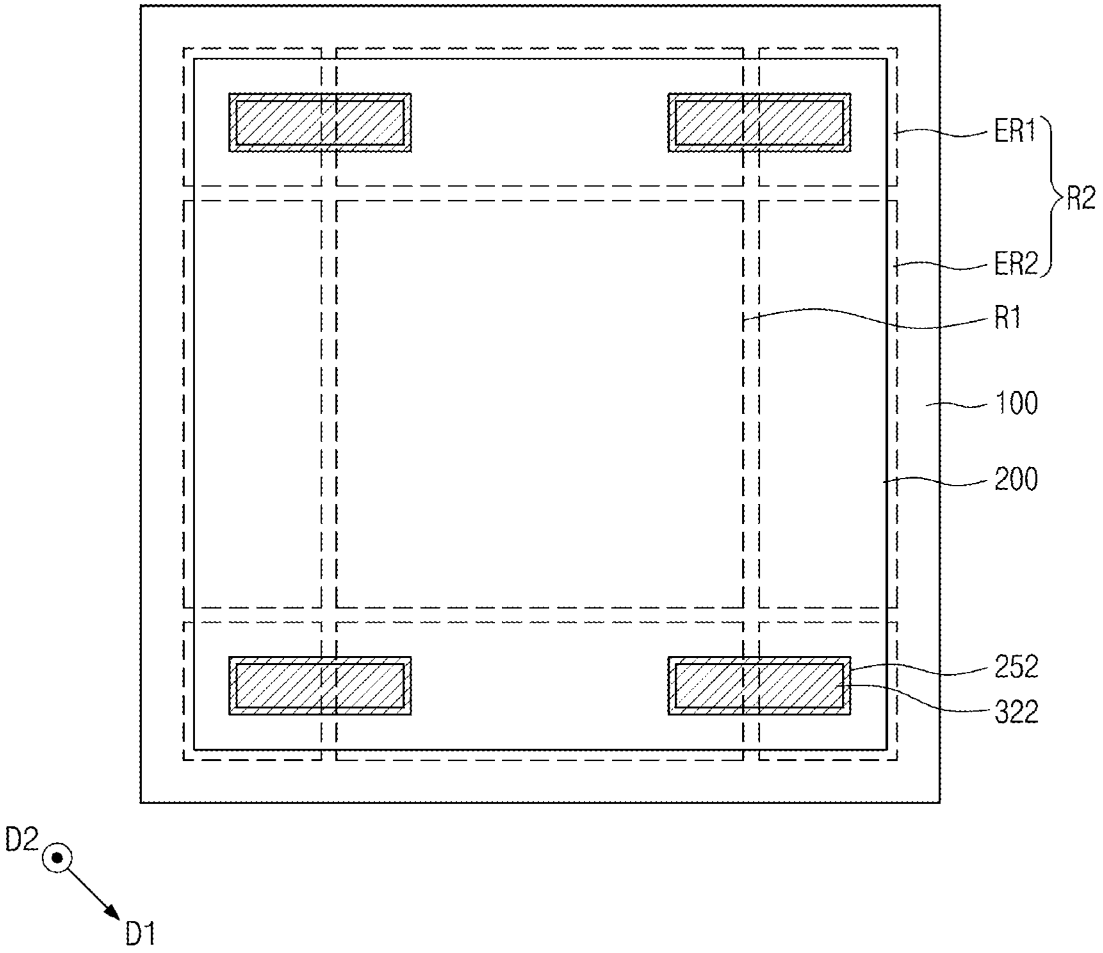
FIG. 4E illustrates a plan view showing a semiconductor package according to some embodiments.

As shown in FIG. 4E, the dummy pillars 322 may each have a rectangular shape when viewed in plan. At least one of the dummy pillars 322 may, e.g., continuously, overlap the first edge region ER1 and the second edge region ER2 of the semiconductor chip 200, e.g., as viewed in a top view.

Figure 4F:
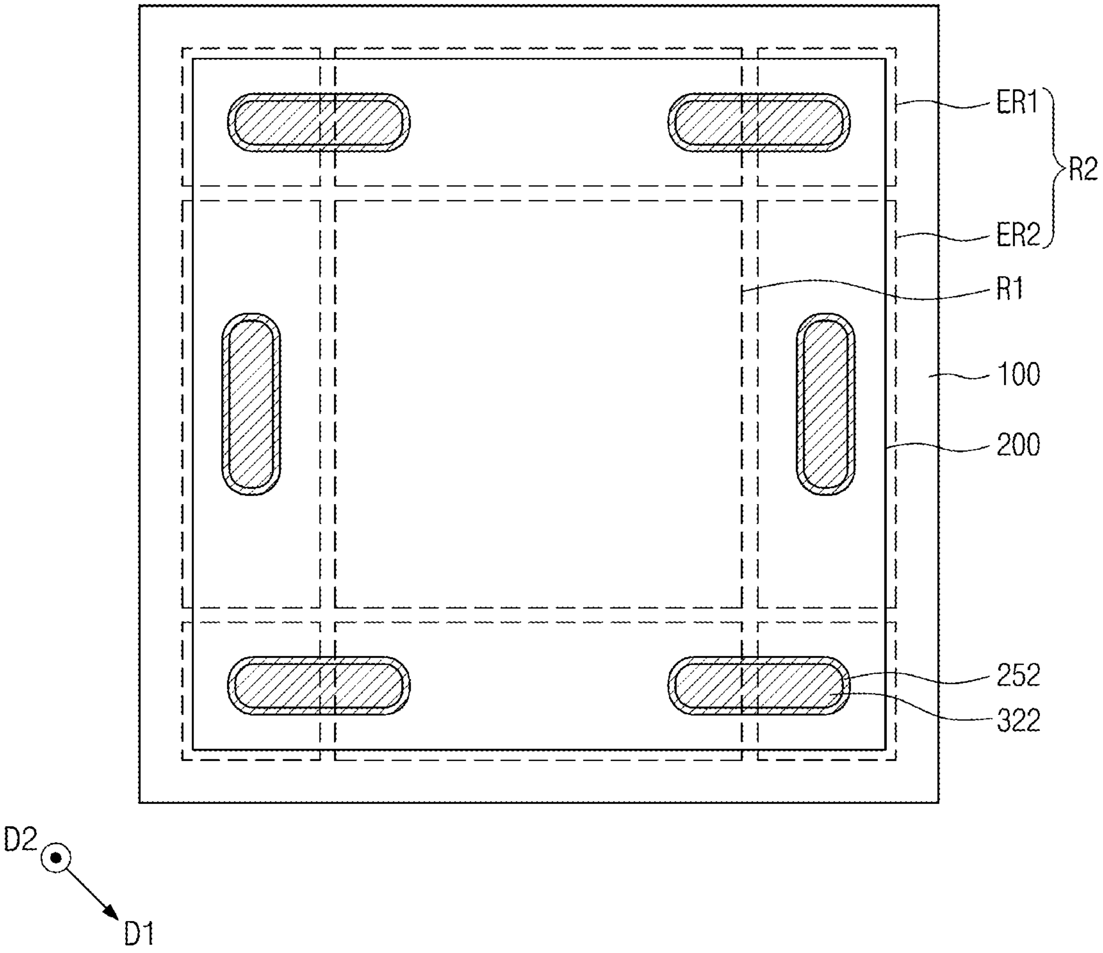
FIG. 4F illustrates a plan view showing a semiconductor package according to some embodiments.

As shown in FIG. 4F, the dummy pillars 322 may each have an oval shape when viewed in plan. At least one of the dummy pillars 322 may, e.g., continuously, overlap the first edge region ER1 and the second edge region ER2 of the semiconductor chip 200, e.g., as viewed in a top view.

The embodiments of FIGS. 4A, 4B, 4D, 4E, and 4F may be combined with each other. For example, the dummy pillars 322 may each have a rectangular shape as illustrated in FIG. 4D, and may be further provided on the first region R1 of the semiconductor chip 200, as illustrated in FIG. 4B.

Figure 5A:
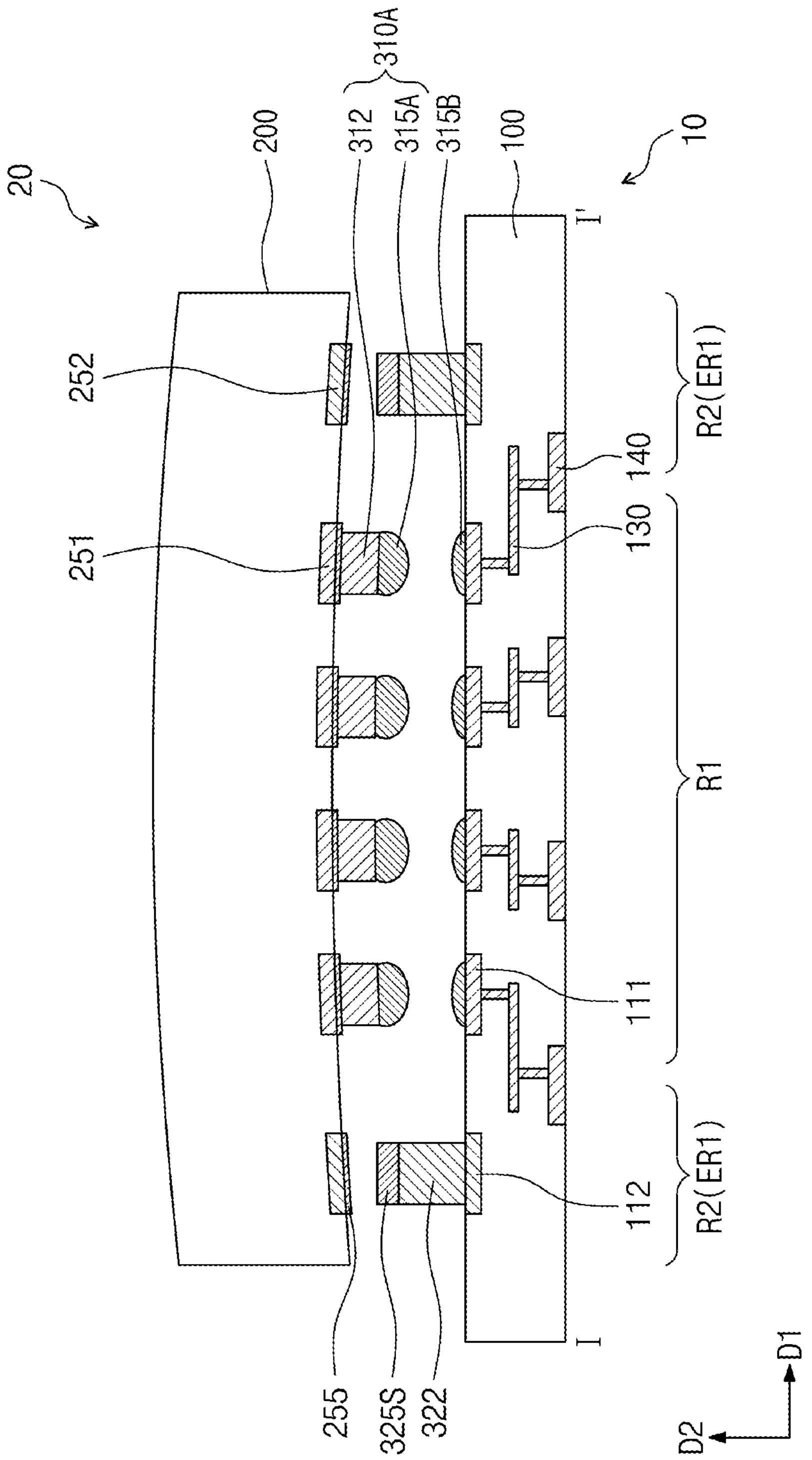
FIG. 5A illustrates a cross-sectional view showing a substrate structure and a semiconductor device according to some embodiments.

The following will describe a substrate structure and a semiconductor device according to some embodiments with reference to FIG. 5A. FIG. 5A illustrates a cross-sectional view taken along line I-I' of FIG. 1A.

Referring to FIG. 5A, the semiconductor device 20 may be disposed on the substrate structure 10. The substrate structure 10 and the semiconductor device 20 may be substantially those discussed in the example of FIG. 2A. For example, the semiconductor device 20 may include the semiconductor chip 200 and the conductive connection bumps 310A, and may further include protection patterns 255. The protection patterns 255 may be provided on a bottom surface of the dummy chip pad 252 and a bottom surface of the connection chip pad 251. Alternatively, the protection patterns 255 may not be provided on a bottom surface of the connection chip pad 251. The protection patterns 255 may include a different material from that of the dummy chip pad 252. For example, the protection patterns 255 may include a metallic material, e.g., one or more of nickel, gold, and palladium. For another example, the protection patterns 255 may include an organic layer, e.g., organic solderability preservative. The protection patterns 255 may prevent oxidation of the dummy chip pad 252. The methods discussed in the examples of FIGS. 2B to 2G may be performed to fabricate the semiconductor package of FIG. 1B.

Figure 5B:
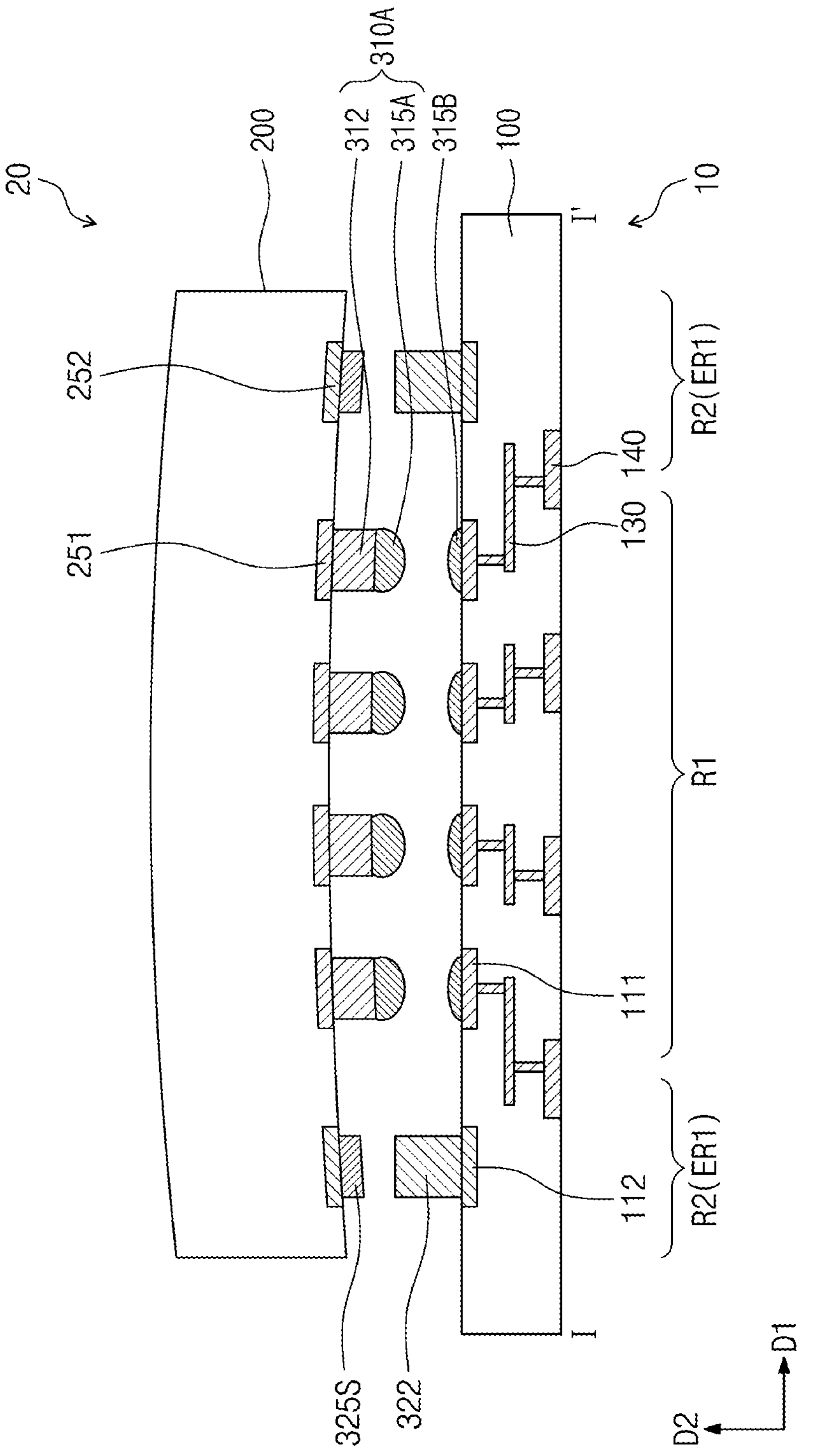
FIG. 5B illustrates a cross-sectional view showing a substrate structure and a semiconductor device according to some embodiments.

FIG. 5B illustrates a cross-sectional view taken along line I-I' of FIG. 1A, showing a substrate structure and a semiconductor device according to other embodiments.

Referring to FIG. 5B, the semiconductor device 20 may be disposed on the substrate structure 10. The substrate structure 10 may not include the dummy solder part 325S, and the semiconductor device 20 may include the dummy solder part 325S. For example, the dummy solder part 325S may be provided on a bottom surface of the dummy chip pad 252. The placement of the semiconductor device 20 on the substrate structure 10 may include vertically aligning the dummy solder part 325S with the dummy pillar 322. Afterward, the methods discussed in the examples of FIGS. 2B to 2G may be performed to fabricate the semiconductor package of FIG. 1B.

Figure 5C:
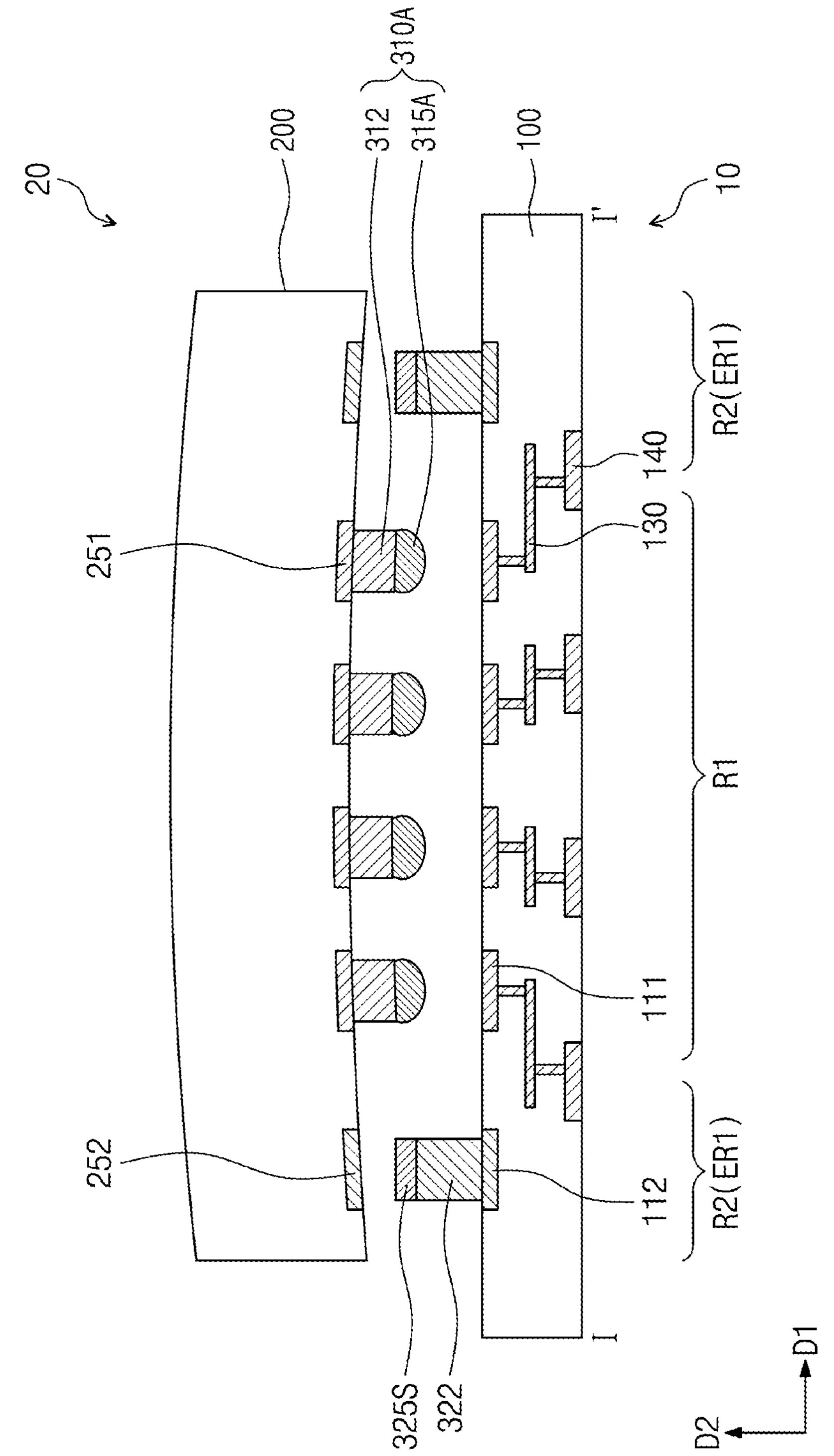
FIG. 5C illustrates a cross-sectional view showing a substrate structure and a semiconductor device according to some embodiments.

FIG. 5C illustrates a cross-sectional view taken along line I-I' of FIG. 1A, showing a substrate structure and a semiconductor device according to some other embodiments.

Referring to FIG. 5C, the semiconductor device 20 may be disposed on the substrate structure 10. The substrate structure 10 may not include the first connection solder part 315B. After that, methods discussed in the examples of FIGS. 2B to 2G may be performed to fabricate the semiconductor package 1 of FIG. 1B. In contrast, the second connection solder part 315A may be in direct contact with the connection substrate pad 111. The reflow process discussed in FIGS. 2E and 2F may include reflowing the second connection solder part 315A to form the connection solder pattern 315. The connection solder pattern 315 may be bonded to the connection substrate pad 111.

Figure 6A:
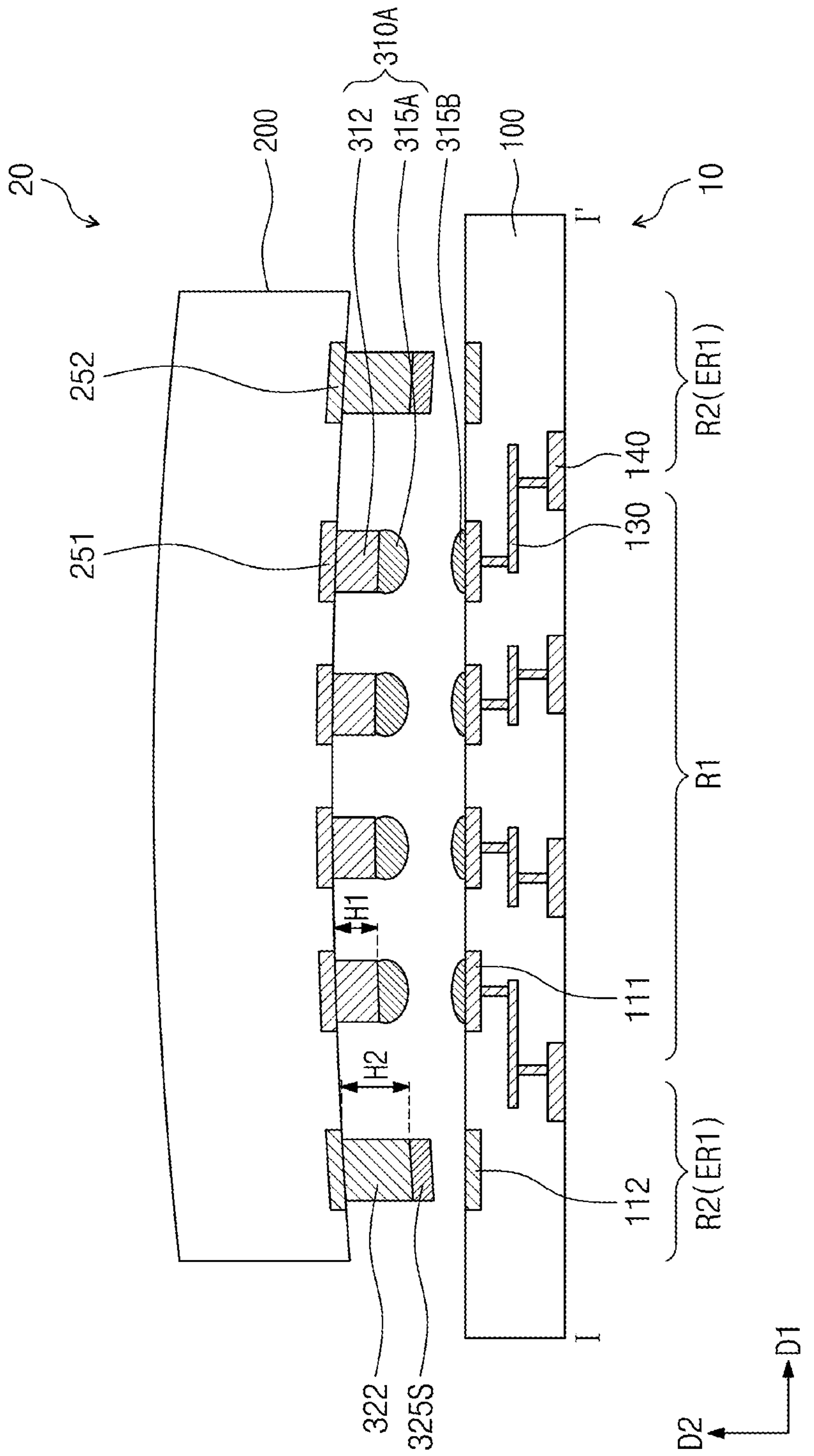
FIG. 6A illustrates a cross-sectional view showing a substrate structure and a semiconductor device according to some embodiments.
Figure 6B:
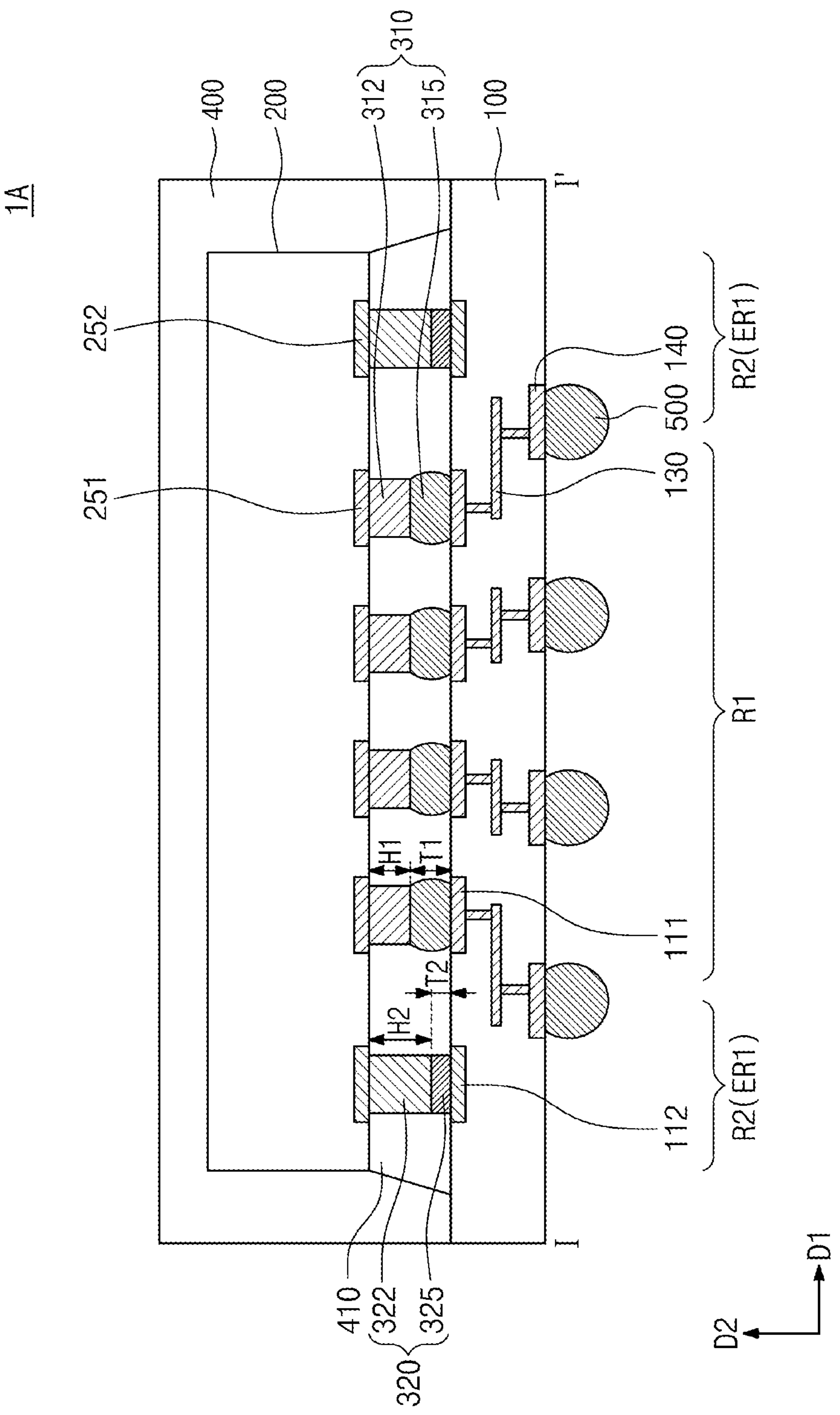
FIG. 6B illustrates a cross-sectional view showing a semiconductor package fabricated using the substrate structure and the semiconductor device of FIG. 6A.

FIG. 6A illustrates a cross-sectional view showing a substrate structure and a semiconductor device according to some embodiments. FIG. 6B illustrates a cross-sectional view showing a semiconductor package fabricated using the substrate structure and the semiconductor device of FIG. 6A. FIGS. 6A and 6B illustrate cross-sectional views taken along line I-I' of FIG. 1A.

Referring to FIG. 6A, the semiconductor device 20 may be disposed on the substrate structure 10. The semiconductor device 20 may include the dummy pillar 322 and the dummy solder part 325S, in addition to the semiconductor chip 200 and the conductive connection bump 310A. The dummy pillar 322 may be interposed between the dummy chip pad 252 and the dummy solder part 325S. The second height H2 of the dummy pillar 322 may be greater than the first height H1 of the connection pillar 312. Therefore, the dummy pillar 322 may have a bottom surface located at a lower level than that of a bottom surface of the connection pillar 312. The dummy solder part 325S may be vertically spaced apart from the dummy substrate pad 112.

The substrate structure 10 may include the package substrate 100 and the first connection solder part 315B. Differently from that shown, the first connection solder part 315B may be omitted.

Referring to FIG. 6B, the same methods as those discussed in the examples of FIGS. 2B to 2G may be performed to form the dummy bump 320 and the connection bump 310. Therefore, the semiconductor chip 200 may be electrically connected to the package substrate 100. The dummy bump 320 may include the dummy pillar 322 and the dummy solder pattern 325. The dummy solder pattern 325 may be interposed between the dummy pillar 322 and the dummy substrate pad 112. The dummy solder pattern 325 may include an intermetallic compound including, e.g., consisting of, the second metal element contained in the dummy pillar 322, a metal element contained in the dummy substrate pad 112, and the second solder material. For example, the metal element contained in the dummy substrate pad 112 may be the same element (e.g., copper) as the second metal element. In another example, the metal element contained in the dummy substrate pad 112 may be different from the second metal element. The second thickness T2 of the dummy solder pattern 325 may be less than the second height H2 of the dummy pillar 322.

The connection bump 310 may include the connection solder pattern 315 and the connection pillar 312. The first thickness T1 of the connection solder pattern 315 may be greater than the second thickness T2 of the dummy solder pattern 325. A sum of the second thickness T2 and the second height H2 may be substantially the same as that of the first thickness T1 and the first height H1. The solder balls 500 may be attached to a bottom surface of the package substrate 100, and thus a semiconductor package 1A may be fabricated.

Figure 7A:
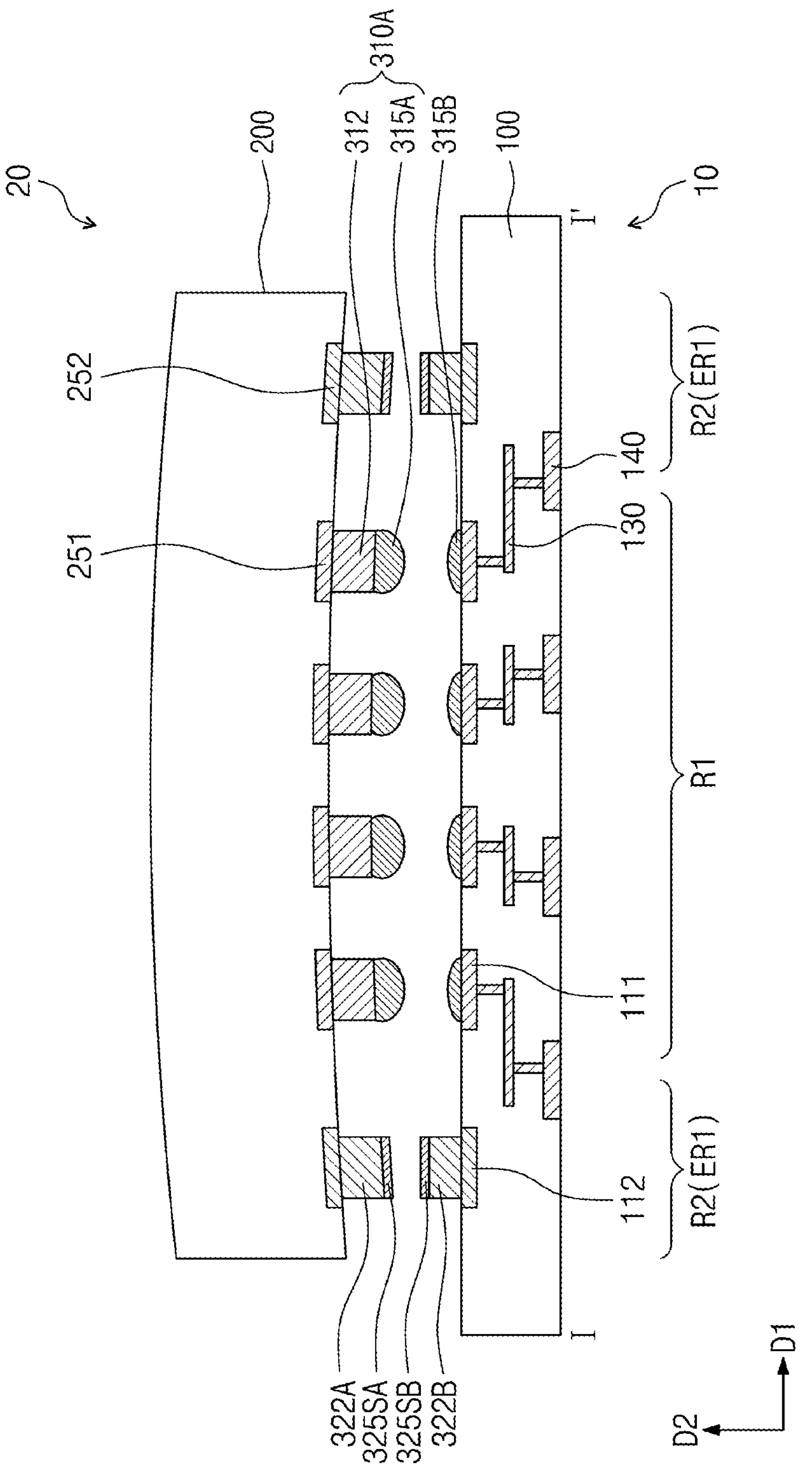
FIG. 7A illustrates a cross-sectional view showing a substrate structure and a semiconductor device according to some embodiments.
Figure 7B:
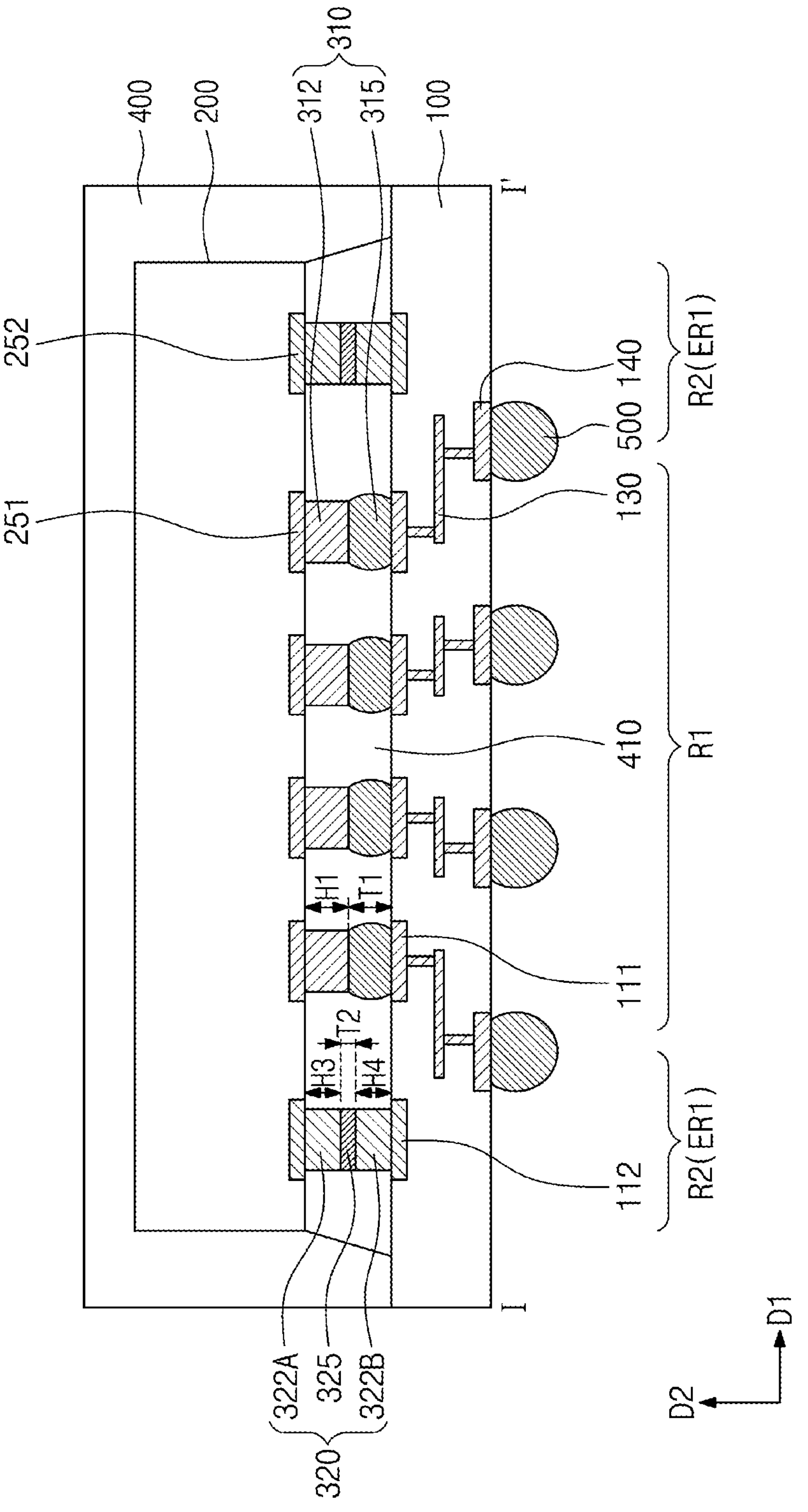
FIG. 7B illustrates a cross-sectional view showing a semiconductor package fabricated using the substrate structure and the semiconductor device of FIG. 7A.

FIG. 7A illustrates a cross-sectional view showing a substrate structure and a semiconductor device according to some embodiments. FIG. 7B illustrates a cross-sectional view showing a semiconductor package fabricated using the substrate structure and the semiconductor device of FIG. 7A. FIGS. 7A and 7B illustrate cross-sectional views taken along line I-I' of FIG. 1A.

Referring to FIG. 7A, the semiconductor device 20 may be disposed on the substrate structure 10. The semiconductor device 20 may include an upper dummy pillar 322A and an upper dummy solder part 325SA, in addition to the semiconductor chip 200 and the conductive connection bump 310A. The upper dummy pillar 322A may include one or more materials discussed in the example of the dummy pillar 322 shown in FIGS. 1A to 1C. The upper dummy pillar 322A may be interposed between the dummy chip pad 252 and the upper dummy solder part 325SA. The upper dummy solder part 325SA may be vertically spaced apart from the substrate structure 10. The upper dummy solder part 325SA may include the second solder material.

The substrate structure 10 may include the package substrate 100, the first connection solder part 315B, a lower dummy pillar 322B, and a lower dummy solder part 325SB. The lower dummy pillar 322B may include one or more of the materials discussed in the example of the dummy pillar 322 shown in FIGS. 1A to 1C. The lower dummy pillar 322B may include a third solder material. The third solder material may include one of the elements discussed in the example of the second solder material, and may have a melting point of about 100° C. to about 180° C. For example, the third solder material may include the same element as that of the second solder material, and may have the same composition ratio as that of the second solder material.

Referring to FIG. 7B, the same methods as those discussed in the examples of FIGS. 2B to 2G may be performed to form the dummy bump 320 and the connection bump 310. Therefore, the semiconductor chip 200 may be electrically connected to the package substrate 100. In contrast, the dummy bump 320 may include the lower dummy pillar 322B, the upper dummy pillar 322A, and the dummy solder pattern 325. The dummy solder pattern 325 may be interposed between the lower dummy pillar 322B and the upper dummy pillar 322A. The dummy solder pattern 325 may include an intermetallic compound including, e.g., consisting of, metal contained in the lower dummy pillar 322B, metal contained in the upper dummy pillar 322A, the second solder material, and the third solder material.

A sum of a height H4 of the lower dummy pillar 322B, a height H3 of the upper dummy pillar 322A, and the second thickness T2 may be substantially the same as that of the first thickness T1 and the first height H1. A sum of the height H4 of the lower dummy pillar 322B and the height H3 of the upper dummy pillar 322A may be greater than the first height H1. The second thickness T2 may be the same as that discussed in FIGS. 1B and 1C. The solder balls 500 may be attached to a bottom surface of the package substrate 100, and thus a semiconductor package 1B may be fabricated.

By way of summation and review, embodiments provide a semiconductor package with reduced defects and a method of fabricating the same. That is, according to example embodiments, a semiconductor package may include a dummy bump and a connection bump. The dummy bump may include a dummy pillar and a dummy solder pattern. The dummy solder pattern may be formed by a transient liquid phase bonding process, and may include an intermetallic compound. The connection bump may include a connection pillar and a connection solder. During a reflow process for forming a connection solder pattern, the dummy bump may prevent warpage of a semiconductor chip. Therefore, the connection solder may be satisfactorily connected to a package substrate and the semiconductor chip. The occurrence of defects may be prevented during fabrication process for the semiconductor package.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:
- a package substrate;
- a semiconductor chip on the package substrate;
- a connection solder pattern between the package substrate and the semiconductor chip; and
- a dummy bump between the package substrate and the semiconductor chip, the dummy bump being spaced apart from the connection solder pattern,
- wherein the connection solder pattern includes a first intermetallic compound layer, a connection solder layer, and a second intermetallic compound layer,
- wherein the dummy bump includes a dummy pillar and a dummy solder pattern,
- wherein a thickness of the dummy solder pattern is less than a thickness of the connection solder pattern, and
- wherein a melting point of the dummy solder pattern is greater than a melting point of the connection solder layer.

2. The semiconductor package as claimed in claim 1, wherein:
- the connection solder layer includes a first solder material,
- the dummy solder pattern includes an intermetallic compound including a second solder material, and
- the second solder material is different from the first solder material.

3. The semiconductor package as claimed in claim 1, wherein the connection solder layer includes no intermetallic compound.

4. The semiconductor package as claimed in claim 1, wherein:
- the semiconductor chip includes a dummy chip pad on a bottom surface of the semiconductor chip,
- the dummy chip pad includes a first metal element, the dummy pillar includes a second metal element, and the dummy solder pattern includes an intermetallic compound consisting of the first metal element, the second metal element, and a solder material.

5. The semiconductor package as claimed in claim 4, wherein the second metal element is the same as or different from the first metal element.

6. The semiconductor package as claimed in claim 1, further comprising a connection pillar coupled to the connection solder pattern, the connection pillar being between the semiconductor chip and the connection solder pattern, and the dummy pillar being between the package substrate and the dummy solder pattern.

7. The semiconductor package as claimed in claim 1, wherein:

the semiconductor chip has a central region and an edge region, when viewed in a plan view, and the dummy bump is on a bottom surface at the edge region of the semiconductor chip.

8. The semiconductor package as claimed in claim 1, wherein the thickness of the dummy solder pattern is in a range of about 5 μm to about 10 μm.

9. The semiconductor package as claimed in claim 1, wherein the connection solder layer is between the first intermetallic compound layer and the second intermetallic compound layer.

10. A semiconductor package, comprising:

a package substrate;

a semiconductor chip on the package substrate;

a connection bump between the package substrate and the semiconductor chip, the connection bump including a connection solder layer, and the connection solder layer including a first solder material; and a dummy bump between the package substrate and the semiconductor chip, the dummy bump being spaced apart from the connection bump, and the dummy bump including:

at least one dummy pillar, and a dummy solder pattern on the at least one dummy pillar, the dummy solder pattern including an intermetallic compound having a second solder material different from the first solder material, and a melting point of the dummy solder pattern being greater than a melting point of the connection solder layer.

11. The semiconductor package as claimed in claim 10, wherein the connection bump further includes a connection pillar electrically connected to the connection solder layer, a height of the at least one dummy pillar being greater than a height of the connection pillar.

12. The semiconductor package as claimed in claim 11, wherein:

the first solder material includes tin in an amount equal to or greater than about 50 wt %, based on a total weight of the first solder material, and the second solder material includes:

bismuth in an amount equal to or greater than about 20 wt %, based on a total weight of the second solder material, or indium in an amount equal to or greater than about 20 wt %, based on a total weight of the second solder material.

13. The semiconductor package as claimed in claim 11, wherein:

the connection bump further includes a first intermetallic compound layer and a second intermetallic compound layer, the connection solder layer is between the first intermetallic compound layer and the second intermetallic compound layer, and a thickness of the dummy solder pattern is less than a sum of a thickness of the first intermetallic compound layer, a thickness of the connection solder layer, and a thickness of the second intermetallic compound layer.

14. The semiconductor package as claimed in claim 11, wherein:

the package substrate includes a dummy substrate pad on a top surface of the package substrate, the dummy solder pattern is between the dummy substrate pad and the at least one dummy pillar, the dummy substrate pad includes a first metal element, the at least one dummy pillar includes a second metal element, and the intermetallic compound includes a compound consisting of the first metal element, the second metal element, and a solder material.

15. The semiconductor package as claimed in claim 11, wherein:

the melting point of the connection solder layer is in a range of about 210° C. to about 240° C., and the melting point of the dummy solder pattern is in a range of about 270° C. to about 3,000° C.

16. The semiconductor package as claimed in claim 11, wherein:

the semiconductor chip has a central region and an edge region, when viewed in a plan view, the edge region of the semiconductor chip including first edge regions where corners of the semiconductor chip meet each other, and second edge regions between the first edge regions, and the at least one dummy pillar includes a plurality of dummy pillars, the plurality of dummy pillars being on the first edge regions of the semiconductor chip, respectively.

17. A semiconductor package, comprising:

a package substrate that includes a connection substrate pad and a dummy substrate pad, the connection substrate pad and the dummy substrate pad being on a top surface of the package substrate;

a plurality of solder balls on a bottom surface of the package substrate;

a semiconductor chip on the top surface of the package substrate, the semiconductor chip including a dummy chip pad and a connection chip pad on a bottom surface of the semiconductor chip;

a molding layer on the top surface of the package substrate, the molding layer covering the semiconductor chip;

connection bumps between the connection substrate pad and the connection chip pad; and a dummy bump between the dummy substrate pad and the dummy chip pad, the dummy bump being spaced apart from the connection bumps, wherein each of the connection bumps includes:

a connection pillar; and a connection solder pattern on one surface of the connection pillar, the connection solder pattern including a first intermetallic compound layer, a connection solder layer, and a second intermetallic compound layer, wherein the dummy bump includes:

a dummy pillar; and a dummy solder pattern on one surface of the dummy pillar, wherein the connection solder layer includes a first solder material, wherein the dummy solder pattern includes an intermetallic compound including a second solder material different from the first solder material, and wherein a thickness of the dummy solder pattern is less than a thickness of the connection solder pattern.

18. The semiconductor package as claimed in claim 17, wherein a melting point of the dummy solder pattern is greater than a melting point of the connection solder layer.

19. The semiconductor package as claimed in claim 17, wherein:

the dummy solder pattern is in contact with the dummy chip pad and the dummy pillar, the dummy chip pad includes a first metal element, the dummy pillar includes a second metal element, and the intermetallic compound includes a compound consisting of the first metal element, the second metal element, and the second solder material.

20. The semiconductor package as claimed in claim 17, wherein:

the semiconductor chip further includes a plurality of integrated circuits therein, the integrated circuits being electrically separated from the dummy chip pad, and the package substrate further includes a plurality of internal lines therein, the internal lines being electrically separated from the dummy substrate pad.

* * * * *